United States Patent
Borsari et al.

(10) Patent No.: US 11,729,964 B2
(45) Date of Patent: Aug. 15, 2023

(54) METHODS OF FORMING AN APPARATUS INCLUDING LAMINATE SPACER STRUCTURES

(71) Applicant: Micron Technology, Inc., Boise, ID (US)

(72) Inventors: Silvia Borsari, Boise, ID (US); Stian E. Wood, Meridian, ID (US); Haoyu Li, Boise, ID (US); Yiping Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 17/449,352

(22) Filed: Sep. 29, 2021

(65) Prior Publication Data

US 2022/0020748 A1 Jan. 20, 2022

Related U.S. Application Data

(62) Division of application No. 16/420,429, filed on May 23, 2019, now Pat. No. 11,164,873.

(51) Int. Cl.
| | |
|---|---|
| *H01L 27/108* | (2006.01) |
| *H01L 21/768* | (2006.01) |
| *H01L 27/08* | (2006.01) |
| *H10B 12/00* | (2023.01) |

(52) U.S. Cl.
CPC ....... *H10B 12/30* (2023.02); *H01L 21/76831* (2013.01); *H01L 21/76832* (2013.01); *H01L 21/76834* (2013.01); *H01L 27/0814* (2013.01); *H10B 12/03* (2023.02); *H10B 12/0335* (2023.02); *H10B 12/482* (2023.02); *H10B 12/488* (2023.02); *H01L 2221/1057* (2013.01)

(58) Field of Classification Search
CPC .............. H10B 12/0335; H10B 12/315; H01L 21/76831; H01L 21/76832; H01L 21/76834; H01L 2221/1057
See application file for complete search history.

(56) References Cited

U.S. PATENT DOCUMENTS

| | | | |
|---|---|---|---|
| 6,562,703 B1 | 5/2003 | Maa et al. | |
| 7,304,328 B2 | 12/2007 | Bedell et al. | |
| 2007/0042580 A1 | 2/2007 | Al-Bayati et al. | |
| 2007/0123040 A1* | 5/2007 | Hwang | H01L 21/76897 438/672 |
| 2007/0155150 A1* | 7/2007 | Kim | H01L 21/76831 438/597 |
| 2012/0058637 A1* | 3/2012 | Hirota | H01L 27/10885 438/624 |

* cited by examiner

*Primary Examiner* — Marcos D. Pizarro
(74) *Attorney, Agent, or Firm* — TraskBritt

(57) ABSTRACT

An apparatus comprises a conductive structure, another conductive structure, and a laminate spacer structure interposed between the conductive structure and the another conductive structure in a first direction. The laminate spacer structure comprises a dielectric spacer structure, another dielectric spacer structure, and an additional dielectric spacer structure interposed between the dielectric spacer structure and the another dielectric spacer structure. The additional dielectric spacer structure comprises at least one dielectric material, and gas pockets dispersed within the at least one dielectric material. Additional apparatuses, memory devices, electronic systems, and a method of forming an apparatus are also described.

20 Claims, 9 Drawing Sheets

METHODS OF FORMING AN APPARATUS INCLUDING LAMINATE SPACER STRUCTURES

CROSS-REFERENCE TO RELATED APPLICATION

This application is a divisional of U.S. patent application Ser. No. 16/420,429, filed May 23, 2019, now U.S. Pat. No. 11,164,873, issued Nov. 2, 20221, the disclosure of which is hereby incorporated herein in its entirety by this reference.

TECHNICAL FIELD

Embodiments of the disclosure relate to the field of microelectronic device design and fabrication. More specifically, embodiments of the disclosure relate to apparatuses including laminate spacer structures, and to related memory devices, electronic systems, and methods.

BACKGROUND

Designers of microelectronic devices, such as semiconductor devices continuously desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

A relatively common microelectronic device is a memory device. As used herein, the term "memory device" means and includes a microelectronic device incorporating, but not limited to, a memory structure and function. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. A typical access device for a DRAM cell includes a channel region between a pair of source/drain regions, and a gate configured to electrically connect the source/drain regions to one another through the channel region. A typical capacitor for a DRAM cell includes two electrodes and a dielectric structure (e.g., a dielectric film) intervening between and separating the two electrodes. The DRAM cells of a DRAM device are electrically accessible through digit lines and word lines arranged along the rows and columns of the array.

Reducing the dimensions and spacing of memory device features places ever increasing demands on the methods used to form the memory device features. For example, DRAM device manufacturers face a tremendous challenge on reducing the DRAM cell area as feature spacing decreases to accommodate increased feature density. Reducing spacing between closely arranged digit lines can lead to undesirable electrical coupling (e.g., capacitive coupling) effects that can result in significant sense margin loss for high-speed DRAM applications. One approach to reducing such undesirable electrical coupling effects at relatively higher feature densities has been to form air gaps adjacent the digit lines of the array. However, conventional processes of forming such air gaps can undesirably attack (e.g., etch) the conductive material (e.g., metal) of other features of the array located proximate the air gaps. Such attack may effectuate reduced feature and device reliability, requiring complicated processes to mitigate such attack, or resulting in the deposition of the conductive material within the air gaps that may cause electrical shorts during use and operation of the DRAM device.

A need, therefore, exists for new apparatus configurations that avoid the problems associated with conventional apparatus configurations (e.g., conventional configurations including air gaps adjacent conductive structures, such as digit lines), as well as for associated microelectronic devices (e.g., memory devices), electronic systems, and methods of forming an apparatus.

DETAILED DESCRIPTION

Figure 1A:
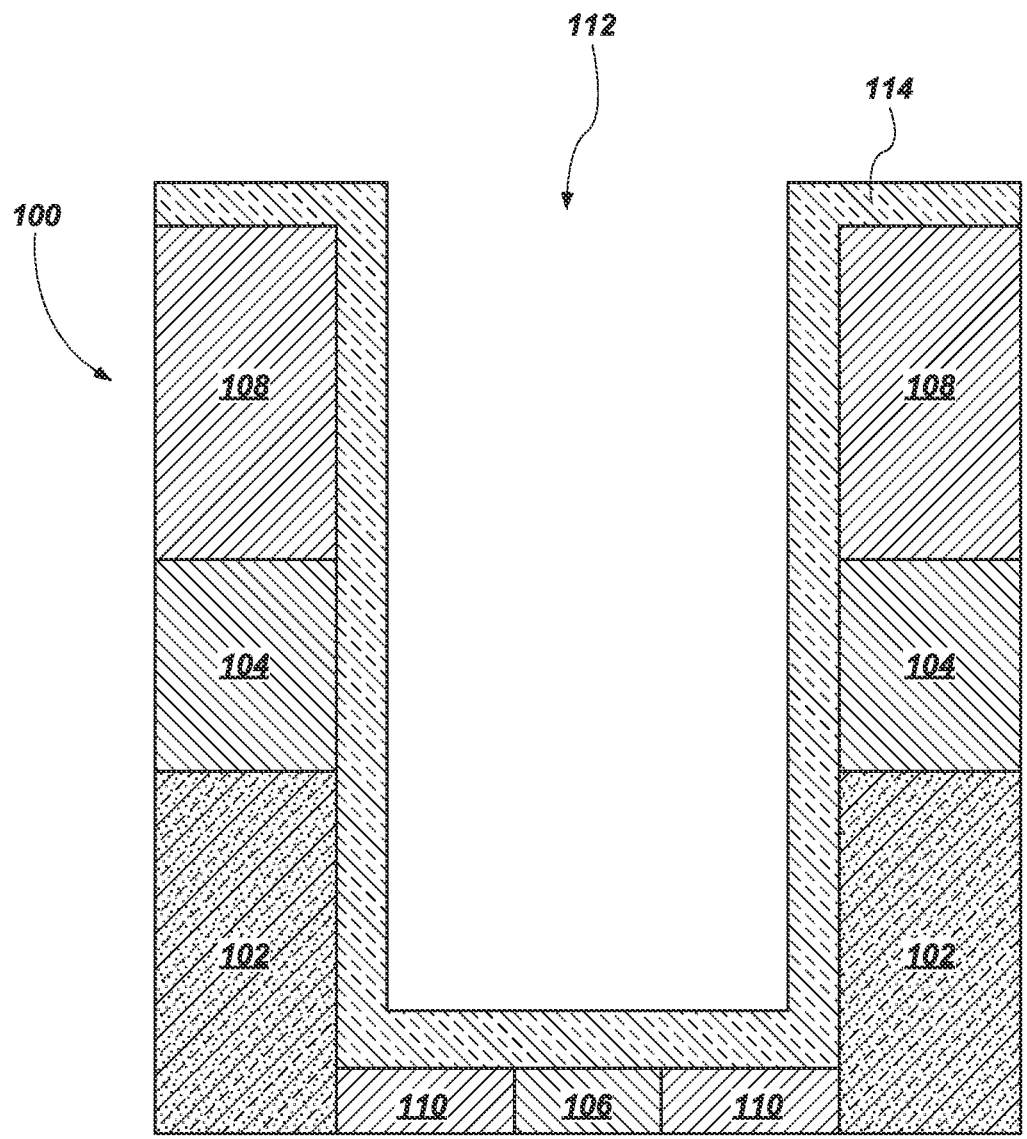
FIGS. 1A through 1G are simplified partial cross-sectional views illustrating embodiments of a method of forming an apparatus, in accordance with embodiments of the disclosure.

Apparatuses including laminate spacer structures are described herein, as are related memory devices, electronic systems, and methods of forming apparatuses. In some embodiments, an apparatus includes a laminate spacer structure interposed between neighboring conductive structures. The laminate spacer structure includes a low-k dielectric spacer structure (e.g., a dielectric spacer structure having a lower dielectric constant (k) than silicon dioxide ($SiO_2$)) interposed between two other dielectric spacer structures. The low-k dielectric spacer structure includes a dielectric material and discrete gas pockets dispersed within the dielectric material. The discrete gas pockets facilitate a lower dielectric constant for the low-k dielectric spacer structure relative to a dielectric spacer structure including the dielectric material but not the discrete gas pockets. In addition, the two dielectric spacer structures of the laminate spacer structure support and protect the low-k dielectric spacer structure. The structures, apparatuses, and methods of the disclosure may facilitate increased feature density, providing enhanced performance in microelectronic devices (e.g., memory devices, such as DRAM devices) and electronic systems that rely on high feature density.

The following description provides specific details, such as material species, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing an apparatus (e.g., a microelectronic device; a semiconductor device; a memory device, such as a DRAM device). The structures described below do not form a complete apparatus. Only those process acts and structures necessary to understand the embodiments of the disclosure are described in detail below. Additional acts to form the complete apparatus from the structures may be performed by conventional fabrication techniques. Also note, any drawings accompanying the application are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "compatible" means that a material does not undesirably react, decompose, or absorb another material, and also that the material does not undesirably impair the chemical and/or mechanical properties of the another material.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, or other known methods.

FIGS. 1A through 1G are simplified partial cross-sectional views illustrating embodiments of a method of forming an apparatus (e.g., a microelectronic device; a semiconductor device; a memory device, such as a DRAM device). With the description provided below, it will be readily apparent to one of ordinary skill in the art that the methods described herein may be used in various devices. In other words, the methods of the disclosure may be used whenever it is desired to form an apparatus.

Referring to FIG. 1A, an apparatus 100 may be formed to include first conductive structures 102 (e.g., conductive interconnect structures), second conductive structures 104 (e.g., conductive line structures, such as digit lines), a third conductive structure 106 (e.g., a conductive interface structure, such as a metal silicide interface structure), first dielectric structures 108 (e.g., dielectric cap structures), second dielectric structures 110 (e.g., dielectric liner structures), an opening 112, and a first dielectric spacer material 114. As shown in FIG. 1A, the second conductive structures 104 may be formed vertically (e.g., in the Z-direction) on or over the first conductive structures 102, and the first dielectric structures 108 may be formed vertically on or over of the second conductive structures 104. The second dielectric structures 110 may be formed horizontally (e.g., in the X-direction) between the first conductive structures 102. The third conductive structure 106 may be formed horizontally (e.g., in the X-direction) between the second dielectric structures 110. The second dielectric structures 110, the third conductive structure 106, and the first conductive structures 102 may be located in, on, or over a base structure (e.g., a substrate, such as a semiconductor substrate), such as a base structure including access devices (e.g., access transistors) of memory cells (e.g., DRAM cells). For example, the third conductive structure 106 may be formed on or over a contact (e.g., a source contact, or a drain contact) of an access device within the base structure. The opening 112 may vertically extend (e.g., in the Z-direction) between and separate each of the first dielectric structures 108, each of the second conductive structures 104, and each the first conductive structures 102; and may terminate (e.g., end) at upper surfaces of the second dielectric structures 110 and the third conductive structure 106. The first dielectric spacer material 114 may be formed inside and outside of the opening 112, on or over surfaces (e.g., upper surfaces, side surfaces) of the first conductive structures 102, the second conductive structures 104, the third conductive structure 106, the first dielectric structures 108, and the second dielectric structures 110.

The first conductive structures 102, the second conductive structures 104, and the third conductive structure 106 may each individually be formed of and include at least one electrically conductive material, such as one or more of at least one metal, at least alloy, at least one conductive metal oxide, at least one conductive metal nitride, at least one conductive metal silicide, and at least one conductively doped semiconductor material. By way of non-limiting example, the first conductive structures 102, the second conductive structures 104, and the third conductive structure 106 may each individually be formed of and include one or more of tungsten (W), tungsten silicide (WSi), tungsten nitride (WN), nickel (Ni), nickel silicide (NiSi), tantalum (Ta), tantalum nitride (TaN), tantalum silicide (TaSi), cobalt silicide (CoSi), platinum (Pt), copper (Cu), silver (Ag), gold (Au), aluminum (Al), molybdenum (Mo), molybdenum silicide (MoSi), titanium (Ti), titanium silicide (TiSi), titanium nitride (TiN), titanium silicon nitride (TiSiN), titanium aluminum nitride (TiAlN), molybdenum nitride (MoN), iridium (Ir), iridium oxide ($IrO_x$), ruthenium (Ru), ruthenium oxide ($RuO_x$), ruthenium titanium nitride (RuTiN), and conductively doped silicon. The first conductive structures 102, the second conductive structures 104, and the third conductive structure 106 may have substantially the same material composition as one another; or one or more of the first conductive structures 102, the second conductive structures 104, and the third conductive structure 106 may have a different material composition than one or more other of the first conductive structures 102, the second conductive structures 104, and the third conductive structure 106. In some embodiments, the material composition of the second conductive structures 104 is different than the material composition of one or more (e.g., each) of the first conductive structures 102 and the third conductive structure 106. As a non-limiting example, the first conductive structures 102 and the second conductive structures 104 may individually comprise one or more of TiN, TiSi, TaN, WN, WSi, TiAlN, Ti, Pt, Rh, Ir, $IrO_x$, Ru, $RuO_x$; and the third conductive structure 106 may comprise one or more of CoSi, NiSi, WSi, TaSi, MoSi, and TiSi.

The first conductive structures 102, the second conductive structures 104, and the third conductive structure 106 may each individually be formed to a desired thickness (e.g., height in the Z-direction). The first conductive structures 102, the second conductive structures 104, and the third conductive structure 106 may each exhibit substantially the same thickness as one another; or one or more of the first conductive structures 102, the second conductive structures 104, and the third conductive structure 106 may exhibit a different thickness than one or more other of the first conductive structures 102, the second conductive structures 104, and the third conductive structure 106. In some embodiments, the thickness of the second conductive structures 104 is less than the thickness of the first conductive structures 102 and greater than the thickness of the third conductive structure 106. In addition, the first conductive structures 102, the second conductive structures 104, and the third conductive structure 106 may each individually be substantially homogeneous throughout the thickness thereof; or one or more (e.g., each) of the first conductive structures 102, the second conductive structures 104, and the third conductive structure 106 may be heterogeneous throughout the thickness thereof. In some embodiments, the first conductive structures 102, the second conductive structures 104, and the third conductive structure 106 are each formed to be substantially homogeneous throughout the thickness thereof.

The first dielectric structures 108 and the second dielectric structures 110 may each individually be formed of and include at least one dielectric material. As a non-limiting example, the first dielectric structures 108 and the second dielectric structures 110 may each individually be formed of and include at least one dielectric material substantially free of oxygen, such as one or more of a dielectric nitride material (e.g., silicon nitride ($SiN_y$)), a dielectric carbonitride material (e.g., silicon carbonitride ($SiC_zN_y$)), and a dielectric boron nitride material (e.g., silicon boron nitride ($SiB_zN_y$), wherein an atomic percentage of B in the $SiB_zN_y$ is within a range of from about 5 atomic percent to about 20 atomic percent). As another non-limiting example, one or more of the first dielectric structures 108 and the second dielectric structures 110 may be formed of and include at least one dielectric material including oxygen, such as a dielectric oxycarbonitride material (e.g., silicon carboxynitride ($SiO_xC_zN_y$)). As used herein, formulae including one or more of "x," "y," and "z" herein (e.g., $SiN_y$, $SiC_zN_y$, $SiB_zN_y$, $SiO_xC_zN_y$) represent a material that contains an average ratio of "x" atoms of one element, "y" atoms of another element, and "z" atoms of an additional element (if any) for every one atom of another element (e.g., Si). As the formulae are representative of relative atomic ratios and not strict chemical structure, the material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the first dielectric structures 108 and the second dielectric structures 110 are each formed of and include silicon nitride ($Si_3N_4$).

The first dielectric structures 108 and the second dielectric structures 110 may each individually be formed to any desired thickness (e.g., height in the Z-direction). The first dielectric structures 108 and the second dielectric structures 110 may each exhibit substantially the same thickness as one another; or the first dielectric structures 108 may exhibit a different thickness than the second dielectric structures 110. In some embodiments, the thickness of the first dielectric structures 108 is greater than the thickness of the second dielectric structures 110. In addition, the first dielectric structures 108 and the second dielectric structures 110 may each individually be substantially homogeneous throughout a thickness thereof; or one or more (e.g., each) of the first dielectric structures 108 and the second dielectric structures 110 may be heterogeneous throughout the thickness thereof. In some embodiments, the first dielectric structures 108 and the second dielectric structures 110 are each formed to be substantially homogeneous throughout the thickness thereof.

With continued reference to FIG. 1A, the opening 112 may be at least partially defined by opposing side surfaces (e.g., opposing sidewalls) of the first conductive structures 102, the second conductive structures 104, and the first dielectric structures 108, and by upper surfaces of the first dielectric structures 108, the second dielectric structures 110, and the third conductive structure 106. For example, the opposing side surfaces of the first conductive structures 102, the second conductive structures 104, and the first dielectric structures 108 may at least partially define horizontal boundaries (e.g., in the X-direction) of the opening 112; the upper surfaces of the third conductive structure 106 and the second dielectric structures 110 may at least partially define lower vertical boundaries (e.g., in the Z-direction) of the opening 112; and the upper surfaces of the first dielectric structures 108 may define upper vertical boundaries (e.g., in the Z-direction) of the opening 112. The opening 112 may vertically overlie the second dielectric structures 110 and the third conductive structure 106, and may horizontally intervene (e.g., in the X-direction) between and separate portions of the first conductive structures 102, the second conductive structures 104, and the first dielectric structures 108. The first dielectric spacer material 114 may be formed inside and outside of the boundaries (e.g., vertical boundaries, horizontal boundaries) of the opening 112, as described in further detail below.

The opening 112 may be formed to exhibit any desired shape and dimensions (e.g., height in the Z-direction, width in the X-direction, and length in another horizontal direction orthogonal to the X-direction). The shape and dimensions of the opening 112 may at least partially depend upon the shapes and dimensions of additional structures (e.g., dielectric structures, conductive structures) to be formed within the openings 112, as described in further detail below. In some embodiments, the opening 112 exhibits a shape and dimensions facilitating the formation of a desired fourth conductive structure (e.g., a conductive contact structure) therein, as well as dielectric spacer structures horizontally intervening (e.g., in the X-direction) between side surfaces of the fourth conductive structure and the opposing side surfaces of the first conductive structures 102, the second conductive structures 104, and the first dielectric structures 108 at least partially defining the horizontal boundaries (e.g., in the X-direction) of the opening 112. By way of non-limiting example, the opening 112 may be formed to exhibit a columnar shape (e.g., a rectangular column shape), a width (e.g., in the X-direction) within a range of from about 50 nanometers (nm) to about 70 nm, and a height (e.g., in the Z-direction) greater than or equal to about two (2) times the width (e.g., a height to width ratio within a range of from about 2:1 to about 100:1, such as from about 2:1 to about 50:1 from about 5:1 to about 40:1, or from about 10:1 to about 30:1).

Still referring to FIG. 1A, the first dielectric spacer material 114 may be formed inside and outside of the boundaries of the opening 112. For example, as shown in FIG. 1A, the first dielectric spacer material 114 may extend (e.g., continuously extend) over surfaces of the first conductive structures 102, the second conductive structures 104, the third conductive structure 106, the first dielectric structures 108, and the second dielectric structures 110 at, inside, and outside of the boundaries (e.g., horizontal boundaries, vertical boundaries) of the opening 112. The first dielectric spacer material 114 may at least partially (e.g., substantially) conform to a topography defined by the surfaces upon which the first dielectric spacer material 114 is formed. The first dielectric spacer material 114 partially (e.g., less than completely) fills the opening 112.

The first dielectric spacer material 114 may be formed of and include at least one dielectric material. The material composition of the first dielectric spacer material 114 may be selected to be compatible with the material compositions of the first conductive structures 102, the second conductive structures 104, and the third conductive structure 106. As a non-limiting example, the first dielectric spacer material 114 may be formed of and include at least one dielectric material substantially free of oxygen, such as one or more of a dielectric nitride material (e.g., $SiN_y$), a dielectric carbonitride material (e.g., $SiC_zN_y$), and a dielectric boron nitride material (e.g., $SiB_zN_y$, wherein an atomic percentage of B in the $SiB_zN_y$ is within a range of from about 5 atomic percent to about 20 atomic percent). As another non-limiting example, the first dielectric spacer material 114 may be formed of and include at least one dielectric material including oxygen, such as a dielectric carboxynitride material (e.g., $SiO_xC_zN_y$). In some embodiments, the first dielectric spacer material 114 comprises a dielectric nitride material (e.g., $Si_3N_4$).

A thickness of the first dielectric spacer material 114 may at least partially depend on the dimensions (e.g., width in the X-direction, height in the Z-direction) of the opening 112 and on dimensions of additional materials and structures to be formed within the opening 112. By way of non-limiting example, the thickness of the first dielectric spacer material 114 may be selected such that a laminate spacer structure including a first dielectric spacer structure formed from the first dielectric spacer material 114 and additional dielectric spacer structures has a width (e.g., in the X-direction) within a range of from about 5 nm to about 10 nm, such as from about 6 nm to about 9 nm. In some embodiments, the first dielectric spacer material 114 is formed to exhibit a thickness within a range of from about 2 nm to about 4 nm. In addition, the first dielectric spacer material 114 be formed to be substantially homogeneous throughout the thickness thereof, or the first dielectric spacer material 114 may formed to be heterogeneous throughout the thickness thereof. In some embodiments, the first dielectric spacer material 114 is formed to be substantially homogeneous throughout the thickness thereof.

The first conductive structures 102, the second conductive structures 104, the third conductive structure 106, the first dielectric structures 108, the second dielectric structures 110, the opening 112, and the first dielectric spacer material 114 may be formed using conventional processes (e.g., conventional deposition processes, such as one or more of in situ growth, spin-on coating, blanket coating, CVD, PECVD, ALD, and PVD; conventional patterning processes, such as conventional photolithography processes; conventional material removal processes, such as conventional etching processes), which are not described in detail herein.

Figure 1B:
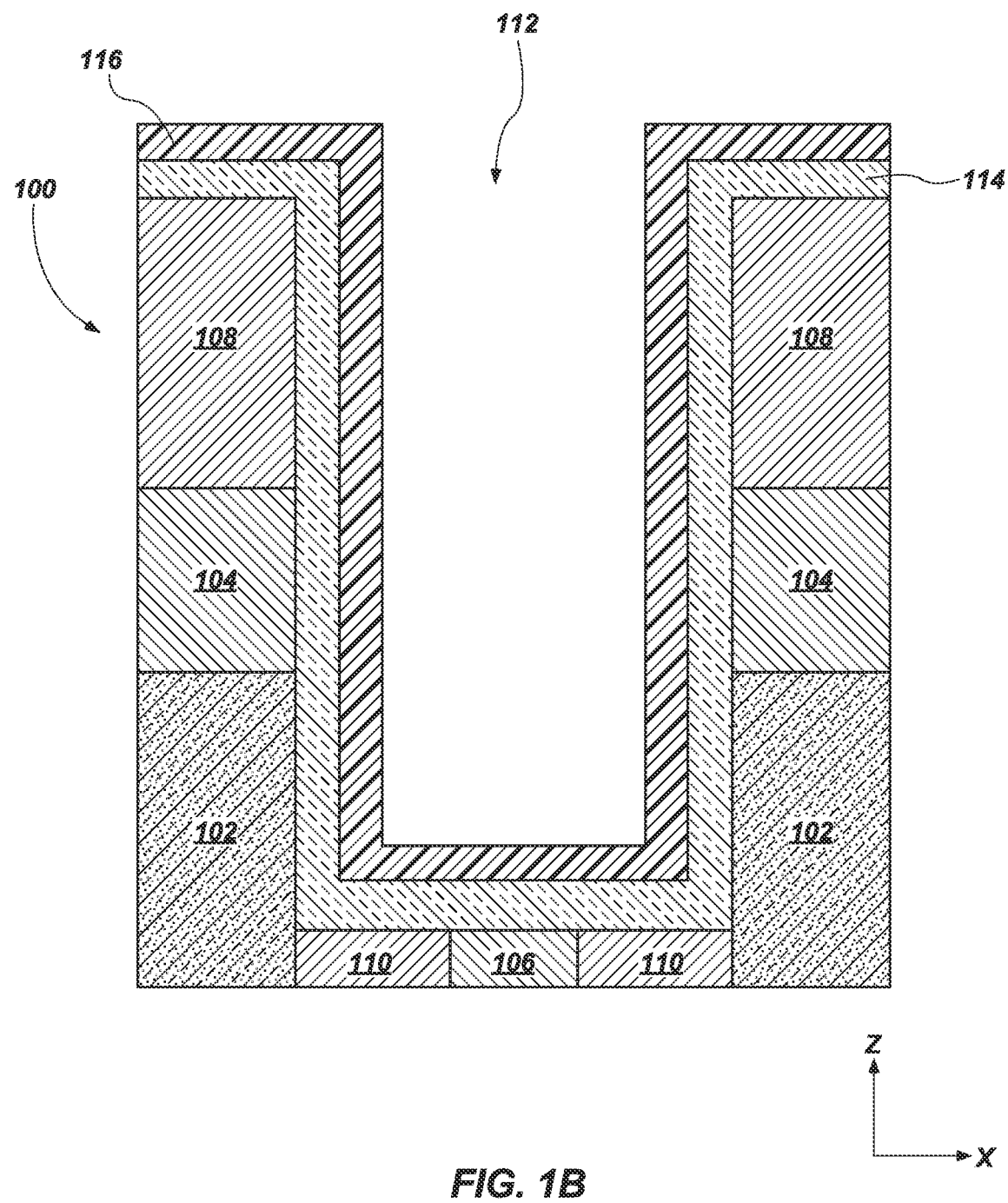

Referring next to FIG. 1B, a second dielectric spacer material 116 may be formed on or over surfaces of the first dielectric spacer material 114 inside and outside of the opening 112. For example, as shown in FIG. 1B, the second dielectric spacer material 116 may be conformally formed on surfaces (e.g., horizontally-extending surfaces, vertically-extending surfaces) of the first dielectric spacer material 114 exposed within the opening 112 and on additional surfaces (e.g., additional horizontally-extending surfaces) of the first dielectric spacer material 114 outside of the opening 112. The second dielectric spacer material 116 may at least partially (e.g., substantially) conform to a topography defined by the surfaces of the first dielectric spacer material 114 upon which the second dielectric spacer material 116 is formed. The second dielectric spacer material 116 partially (e.g., less than completely) fills a remainder the opening 112 (e.g., a portion remaining unfilled by the first dielectric spacer material 114).

The second dielectric spacer material 116 may be formed of and include at least one dielectric material. The material composition of the second dielectric spacer material 116 may be selected such that a low-k dielectric spacer structure subsequently formed from the second dielectric spacer material 116 (described in further detail below) has a lower dielectric constant (k) than that of silicon dioxide ($SiO_2$), such as a dielectric constant lower than about 3.9 (e.g., within a range of from about 1.5 to about 3.8, within a range of from about 2.0 to about 3.8, or within a range of from about 3.0 to about 3.8). The material composition of the second dielectric spacer material 116 may also be selected to be compatible with one or more materials (e.g., dopants) to be provided (e.g., implanted) into the second dielectric spacer material 116 to facilitate the formation discrete gas pockets (e.g., discrete, gaseous bubbles; discrete, gaseous voids) therein, as described in further detail below. As a non-limiting example, the second dielectric spacer material 116 may be formed of and include one or more of at least one dielectric oxide material (e.g., one or more of a silicon oxide ($SiO_x$), phosphosilicate glass, borosilicate glass, borophosphosilicate glass, and fluorosilicate glass), at least one dielectric nitride material (e.g., $SiN_y$), at least one dielectric oxynitride material (e.g., a silicon oxynitride ($SiO_xN_y$)), at least one dielectric carbonitride material (e.g., $SiC_zN_y$), at least one dielectric boron nitride material (e.g., $SiB_zN_y$, wherein an atomic percentage of B in the $SiB_zN_y$ is within a range of from about 5 atomic percent to about 20 atomic percent), at least one dielectric oxycarbide material (e.g., silicon oxycarbide ($SiC_xO_y$)), at least one hydrogenated dielectric oxycarbide material (e.g., hydrogenated silicon oxycarbide ($SiC_xO_yH_z$)), and at least one dielectric carboxynitride material (e.g., $SiO_xC_zN_y$). In some embodiments, the second dielectric spacer material 116 is formed to comprise a dielectric oxide material (e.g., $SiO_2$).

A thickness of the second dielectric spacer material 116 may at least partially dependent on the dimensions (e.g., width in the X-direction, height in the Z-direction) of the opening 112 and on the dimensions of the first dielectric spacer material 114 and on dimensions of additional materials and structures to be formed within the opening 112. By way of non-limiting example, the thickness of the second dielectric spacer material 116 may be selected such that a laminate spacer structure including a first dielectric spacer structure formed from the first dielectric spacer material 114, a second dielectric spacer structure formed from the second dielectric spacer material 116, and at least one additional dielectric spacer structure (e.g., a third dielectric spacer structure) has a width (e.g., in the X-direction) within a range of from about 5 nm to about 10 nm, such as from about 6 nm to about 9 nm. In some embodiments, the second dielectric spacer material 116 is formed to exhibit a thickness within a range of from about 2 nm to about 4 nm. The thickness of the second dielectric spacer material 116 may be substantially the same as (e.g., equal to) the thickness of the first dielectric spacer material 114, or the thickness of the second dielectric spacer material 116 may be different than (e.g., less than or greater than) the thickness of the first dielectric spacer material 114. In some embodiments, the thickness of the second dielectric spacer material 116 is substantially the same as the thickness of the first dielectric spacer material 114. In addition, the second dielectric spacer material 116 may be formed to be substantially homogeneous throughout the thickness thereof, or the second dielectric spacer material 116 may formed to be heterogeneous throughout the thickness thereof. In some embodiments, the second dielectric spacer material 116 is formed to be substantially homogeneous throughout the thickness thereof.

The second dielectric spacer material 116 may be formed (e.g., conformally formed) using conventional processes (e.g., conventional conformal deposition processes), which are not described in detail herein. By way of non-limiting example, the second dielectric spacer material 116 may be formed using one or more of a conventional ALD process and a conventional conformal CVD process. In some embodiments, the second dielectric spacer material 116 is formed on surfaces of the first dielectric spacer material 114 using an ALD process.

Figure 1C:
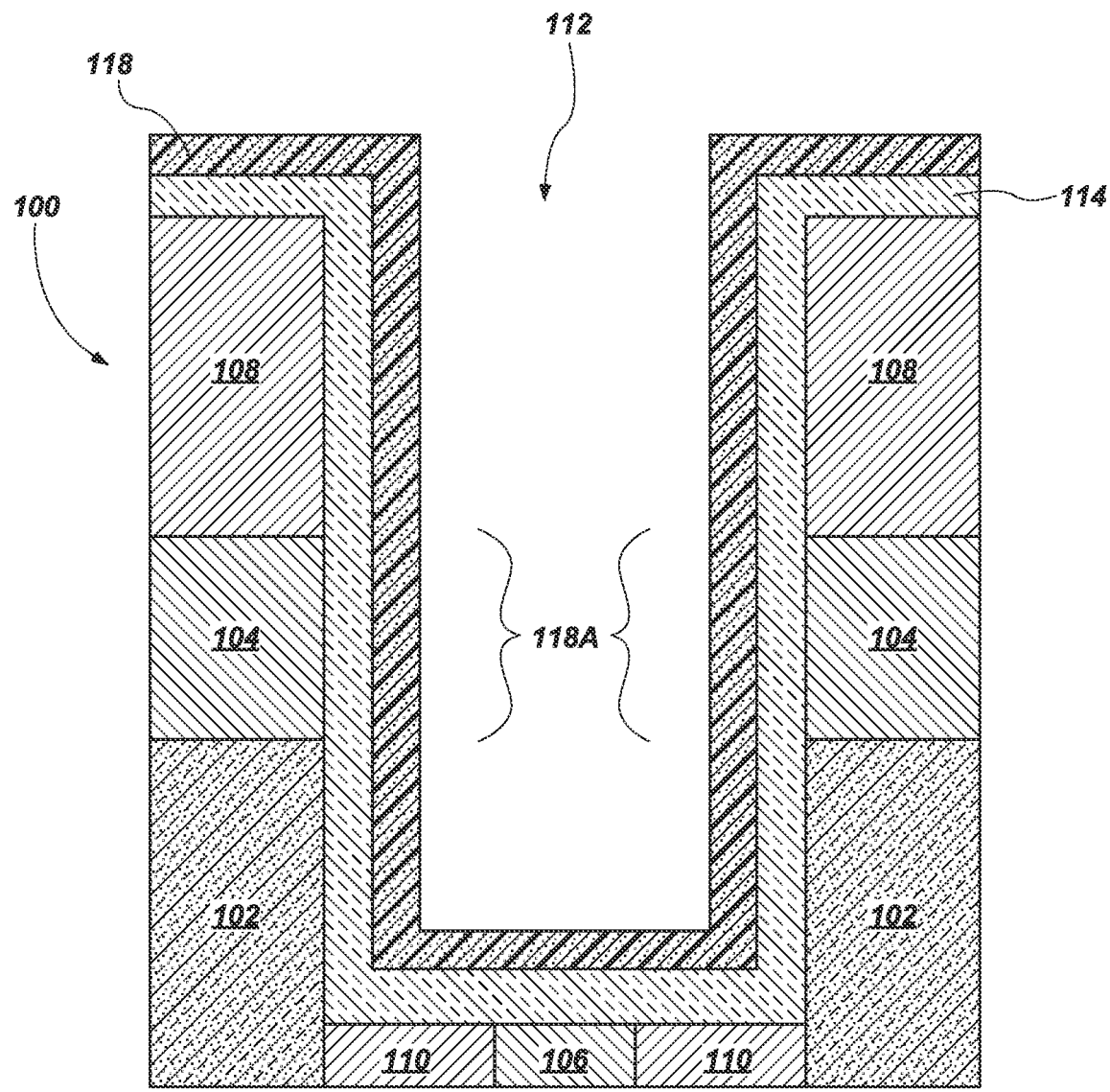

Referring next to FIG. 1C, the second dielectric spacer material 116 (FIG. 1B) may be doped (e.g., impregnated) with one or more dopants (e.g., chemical species) to form a doped second dielectric spacer material 118. The dopant is selected such that individual units (e.g., individual ions, individual atoms, individual molecules) thereof are able to migrate (e.g., diffuse) toward and interact (e.g., coalesce, react) with one another during subsequent processing (e.g., thermal treatment) of the apparatus 100 to form discrete gas pockets (e.g., discrete, gaseous bubbles; discrete, gaseous voids) within dielectric spacer structures formed from the doped second dielectric spacer material 118 (described in further detail below). The dopant is also selected at least partially based on the material composition and the thickness of the second dielectric spacer material 116 (FIG. 1B). The dopant may be substantially non-reactive with the second dielectric spacer material 116 (FIG. 1B) under the conditions (e.g., temperatures, pressures, material exposures) employed to process the apparatus 100. In addition, the dopant may facilitate the subsequent formation of discrete gas pockets that remain stable within the dielectric spacer structure subsequently formed from the doped second dielectric spacer material 118, and that individually exhibit a maximum width (e.g., in the X-direction) less than a width (e.g., in the X-direction) of the subsequently-formed dielectric spacer structure, such as a maximum width within a range of from about one-fifth (⅕) the width of the subsequently-formed dielectric spacer structure to about one-third (⅓) the width of the subsequently-formed dielectric spacer structure.

The dopant may, for example, comprise one or more of hydrogen (H), deuterium ($^2$H), helium (He), and neon (Ne). In some embodiments, the second dielectric spacer material 116 (FIG. 1B) is doped with a hydrogen-containing species. The hydrogen-containing species may, for example, comprise one or more of atomic hydrogen ions ($H^+$) and ionized molecular hydrogen ($H_2^+$). In some embodiments, $H^+$ is implanted into the second dielectric spacer material 116 (FIG. 1B) to form the doped second dielectric spacer material 118. In additional embodiments, $H_2^+$ is implanted into the second dielectric spacer material 116 (FIG. 1B) to form the doped second dielectric spacer material 118.

In some embodiments, the doped second dielectric spacer material 118 is formed to have a substantially homogeneous (e.g., uniform, even, non-variable) distribution of the dopant (e.g., the hydrogen-containing species, such as $H^+$ and/or $H_2^+$) thereof. For example, amounts (e.g., ionic concentrations, atomic concentrations) of the dopant may not substantially vary (e.g., increase, decrease) throughout the dimensions (e.g., the vertical dimensions and the horizontal dimensions) of the doped second dielectric spacer material 118.

In additional embodiments, the doped second dielectric spacer material 118 is formed to have a heterogeneous (e.g., non-uniform, non-even, variable) distribution of the dopant (e.g., the hydrogen-containing species, such as $H^+$ and/or $H_2^+$) thereof. For example, amounts (e.g., ionic concentrations, atomic concentrations) of the dopant may vary (e.g., increase, decrease) throughout one or more of vertical dimensions (e.g., in the Z-direction) and horizontal dimensions (e.g., in the X-direction) of the doped second dielectric spacer material 118. In some embodiments, the doped second dielectric spacer material 118 is formed to have a heterogeneous distribution of the dopant throughout the thickness thereof. For example, amounts of the dopant may vary (e.g., increase, decrease, increase and then decrease, decrease and then increase) in a direction extending away from the first dielectric spacer material 114. Amounts of the dopant may vary stepwise (e.g., change abruptly), or may vary continuously (e.g., change progressively, such as linearly or parabolically) throughout the thickness of the doped second dielectric spacer material 118. In additional embodiments, the doped second dielectric spacer material 118 is formed to have a heterogeneous distribution of the dopant throughout different vertical regions thereof within the opening 112. For example, the doped second dielectric spacer material 118 may have relatively increased amounts of the dopant in first vertically-extending regions 118A thereof within the opening 112 relative to other regions thereof (e.g., other vertically-extending regions within the opening 112, horizontally-extending regions inside and/or outside of the opening 112). As shown in FIG. 1C, the first vertically-extending regions 118A may have vertical boundaries (e.g., upper vertical boundaries, lower vertical boundaries) corresponding to (e.g., substantially the same as) vertical boundaries of the second conductive structures 104. In additional embodiments, the first vertically-extending regions 118A vertically extend (e.g., in the Z-direction) across the vertical dimensions (e.g., height) of the second conductive structures 104, but also vertically extend beyond one or more (e.g., each) of the vertical boundaries of the second conductive structures 104. For example, the upper vertical boundaries of the first vertically-extending regions 118A may be above the upper vertical boundaries of the second conductive structures 104, and/or the lower vertical boundaries of the first vertically-extending regions 118A may be below the lower vertical boundaries of the second conductive structures 104. Amounts of the dopant may vary stepwise (e.g., change abruptly), or may vary continuously (e.g., change progressively, such as linearly or parabolically) throughout the different vertical regions of the doped second dielectric spacer material 118 within the opening 112.

The doped second dielectric spacer material 118 may be formed using conventional processes (e.g., conventional dopant implantation processes), which are not described in detail herein. By way of non-limiting example, the second dielectric spacer material 116 (FIG. 1B) may be doped with one or more dopants to form doped second dielectric spacer material 118 using one or more of a plasma doping (PLAD) implantation process and a beam-line (BL) implantation process. If employed, the PLAD implantation process may implant the dopant across an entirety of the second dielectric spacer material 116 (FIG. 1B). If employed, the BL implantation process may implant the dopant across less than entirety of the second dielectric spacer material 116 (FIG. 1B), such as within one or more predetermined regions of the second dielectric spacer material 116 (FIG. 1B) (e.g., one or more vertically-extending regions within the opening 112), but not within one or more other regions of the second dielectric spacer material 116 (FIG. 1B) (e.g., one or more other vertically-extending regions within the opening 112, one or more horizontally-extending regions inside and/or outside of the opening 112). In some embodiments, a PLAD implantation process is used to form the doped second dielectric spacer material 118. The PLAD implantation process may, for example, employ an implantation dose within a range of from about 2.0E16 ions (e.g., $H^+$) per square centimeter ($cm^2$) to about 1.0E17 ions/$cm^2$ using an acceleration voltage of about 500 volts (V). In additional embodiments, a BL implantation process is used to form the doped second dielectric spacer material 118. The BL implantation process may, for example, employ an implantation dose within a range of from about 2.0E15 ions/$cm^2$ to about 2.5E16 ions/$cm^2$ using an acceleration voltage of about 500 V. The BL implantation process may also employ a predetermined BL tilt angle at least partially determined by the geometric configuration (e.g., height in the Z-direction, width in the X-direction) of the remainder (e.g., unfilled portion) of the opening 112 and the regions (e.g., vertically-extending regions within the opening 112) of the second dielectric spacer material 116 (FIG. 1B) desired to be doped. In some embodiments, the BL tilt angle is about 10 degrees.

Figure 1D:
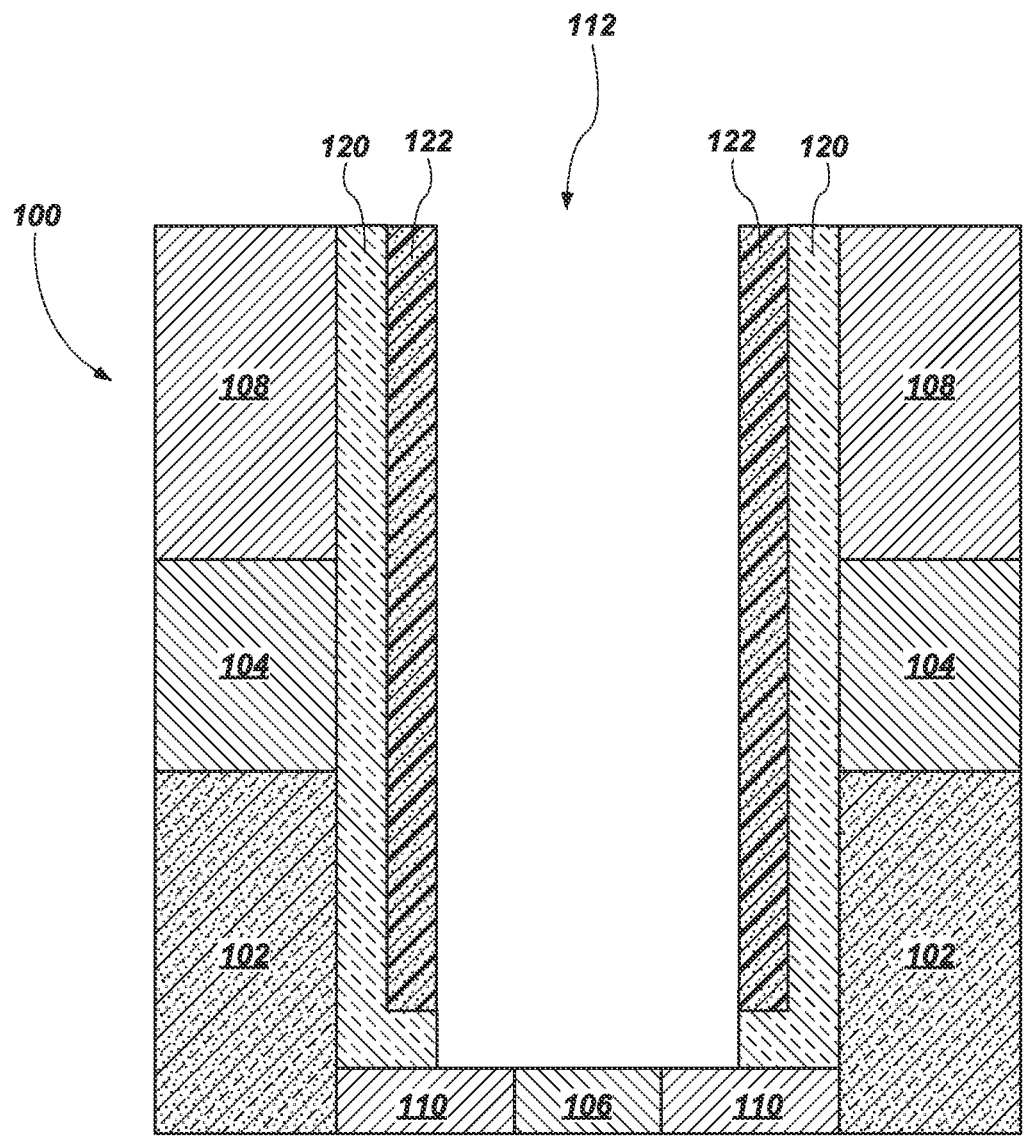

Referring next to FIG. 1D, the first dielectric spacer material 114 (FIG. 1C) and the doped second dielectric spacer material 118 (FIG. 1C) may be subjected to at least one material removal process to form first dielectric spacer structures 120 from the first dielectric spacer material 114, and second dielectric spacer structures 122 from the doped second dielectric spacer material 118. The material removal process may substantially (e.g., completely) remove portions of the first dielectric spacer material 114 and the doped second dielectric spacer material 118 on or over upper surfaces of the first dielectric structures 108 outside of the opening 112, and may partially remove portions of the first dielectric spacer material 114 and the doped second dielectric spacer material 118 on or over upper surfaces of the third conductive structure 106 and the second dielectric structures 110 at a lower vertical boundary of the opening 112. The material removal process may substantially (e.g., completely) expose (e.g., uncover) the upper surface of third conductive structure 106 at the lower vertical boundary of the opening 112. The first dielectric spacer structures 120 may comprise remaining (e.g., unremoved) portions of the first dielectric spacer material 114 on surfaces of the first conductive structures 102, the second conductive structures 104, the first dielectric structures 108, and the second dielectric structures 110 at the boundaries of the opening 112; and the second dielectric spacer structures 122 may comprise remaining (e.g., unremoved) portions of the doped second dielectric spacer material 118 on surfaces of the first dielectric spacer structures 120 within the opening 112.

As shown in FIG. 1D, the first dielectric spacer structures 120 and the second dielectric spacer structures 122 may be confined within the boundaries (e.g., vertical boundaries, horizontal boundaries) of the opening 112. In addition, lower portions of the first dielectric spacer structures 120 may exhibit inner side surfaces substantially coplanar with inner side surfaces of the second dielectric spacer structures 122. The lower portions of the first dielectric spacer structures 120 may vertically underlie (e.g., in the Z-direction) the second dielectric spacer structures 122. Accordingly, the inner side surfaces of the lower portions of the first dielectric spacer structures 120 may be horizontally offset (e.g., in the X-direction) from inner side surfaces of upper portions of the first dielectric spacer structures 120 not vertically underlying the second dielectric spacer structures 122. In additional embodiments, the inner side surfaces of the lower portions of the first dielectric spacer structures 120 may be horizontally offset (e.g., in the X-direction) from the inner side surfaces of the second dielectric spacer structures 122.

The material removal process to form the first dielectric spacer structures 120 and the second dielectric spacer structures 122 may include removing (e.g., de-capping) portions of the doped second dielectric spacer material 118 (FIG. 1C) vertically overlying upper surfaces (e.g., uppermost horizontal surfaces) of the first dielectric spacer material 114 (FIG. 1C) inside and outside of the opening 112, and then removing (e.g., partially removing) uncovered portions of at least the first dielectric spacer material 114 to expose upper surfaces (e.g., uppermost horizontal surfaces) of the first dielectric structures 108 outside of the opening 112 and portions of the upper surfaces of the third conductive structure 106 and the second dielectric structures 110 at the lower vertical boundary of the opening 112. The material removal process may, for example, include one or more of anisotropic dry etching (e.g., one or more of reactive ion etching (RIE), deep RIE, plasma etching, reactive ion beam etching, and chemically assisted ion beam etching) and anisotropic wet etching (e.g., one or more of hydrofluoric acid (HF) etching, buffered HF etching, and buffered oxide etching (BOE)) to form the first dielectric spacer structures 120 and the second dielectric spacer structures 122. In some embodiments, a first anisotropic dry etching process is employed to remove the portions of the doped second dielectric spacer material 118 (FIG. 1C) vertically overlying upper surfaces of the first dielectric spacer material 114 (FIG. 1C) inside and outside of the opening 112, and then a second anisotropic dry etching process is used to partially remove each of uncovered portions of the first dielectric spacer material 114 and remaining portions of the doped second dielectric spacer material 118 to form the first dielectric spacer structures 120 and the second dielectric spacer structures 122. The first anisotropic dry etching process may employ a first dry etchant having higher etch selectivity toward the doped second dielectric spacer material 118 than the first dielectric spacer material 114; and the second anisotropic dry etching process may employ a second dry etchant having a higher etch selectivity toward the first dielectric spacer material 114 than the doped second dielectric spacer material 118.

Figure 1E:
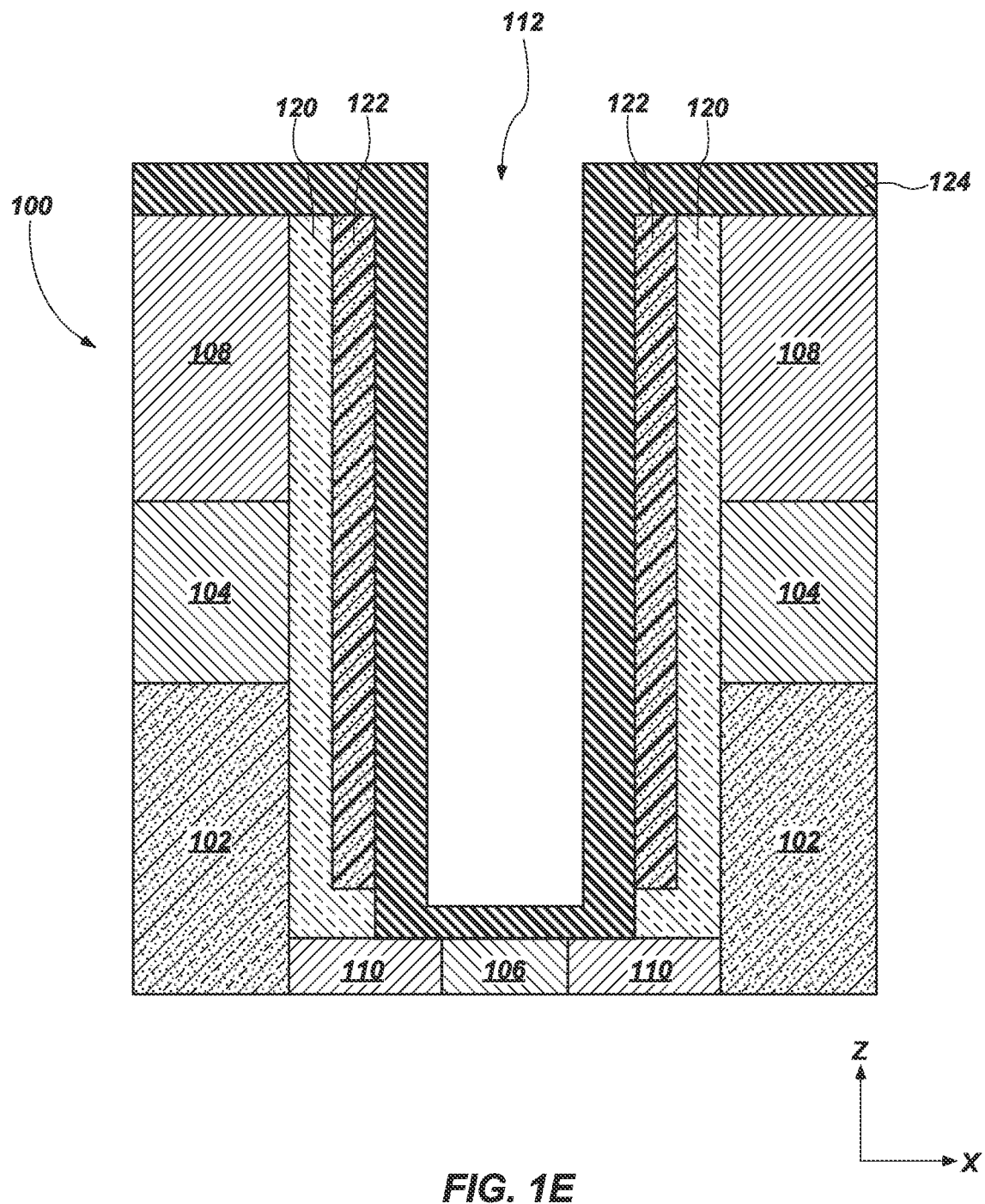

Referring next to FIG. 1E, a third dielectric spacer material 124 may be formed (e.g., conformally formed) on or over surfaces of the first dielectric spacer structures 120, the second dielectric spacer structures 122, the first dielectric structures 108, the second dielectric structures 110, and the third conductive structure 106 at, inside, and outside of the boundaries of the opening 112. The third dielectric spacer material 124 may at least partially (e.g., substantially) conform to a topography defined by the surfaces of the first dielectric spacer structures 120, the second dielectric spacer structures 122, the first dielectric structures 108, the second dielectric structures 110, and the third conductive structure 106 upon which the third dielectric spacer material 124 is formed. The third dielectric spacer material 124 partially (e.g., less than completely) fills a remainder the opening 112 (e.g., a portion remaining unfilled by the first dielectric spacer structures 120 and the second dielectric spacer structures 122).

The third dielectric spacer material 124 may be formed of and include at least one dielectric material. The material composition of the third dielectric spacer material 124 may also be selected to be compatible with the material composition of the third conductive structure 106. As a non-limiting example, the third dielectric spacer material 124 may be formed of and include at least one dielectric material substantially free of oxygen, such as one or more of a dielectric nitride material (e.g., $SiN_y$), a dielectric carbonitride material (e.g., $SiC_zN_y$), and a dielectric boron nitride material (e.g., $SiB_zN_y$, wherein an atomic percentage of B in the $SiB_zN_y$ is within a range of from about 5 atomic percent to about 20 atomic percent). As another non-limiting example, the third dielectric spacer material 124 may be formed of and include at least one dielectric material including oxygen, such as a dielectric carboxynitride material (e.g., $SiO_xC_zN_y$). A material composition of the third dielectric spacer material 124 may different than a material composition of the second dielectric spacer structures 122, and may be substantially the same as or different than a material composition of the first dielectric spacer structures 120. In some embodiments, the third dielectric spacer material 124 comprises a dielectric nitride material (e.g., $Si_3N_4$).

A thickness of the third dielectric spacer material 124 may at least partially dependent on the dimensions (e.g., width in the X-direction, height in the Z-direction) of the opening 112 and on the dimensions of the first dielectric spacer structures 120, the second dielectric spacer structures 122, and additional materials and structures to be formed within the opening 112. By way of non-limiting example, the thickness of the third dielectric spacer material 124 may be selected such that laminate spacer structures including the first dielectric spacer structures 120, modified (e.g., gaseous-void-enhanced) forms of the second dielectric spacer structures 122 (described in further detail below), and third dielectric structures formed from the third dielectric spacer material 124 each have a width (e.g., in the X-direction) within a range of from about 5 nm to about 10 nm, such as from about 6 nm to about 9 nm. In some embodiments, the third dielectric spacer material 124 is formed to exhibit a thickness within a range of from about 2 nm to about 4 nm. The thickness of the third dielectric spacer material 124 may be substantially the same as (e.g., equal to) the thicknesses of the each of first dielectric spacer structures 120 and each of the second dielectric spacer structures 122 (and, hence, of first dielectric spacer material 114 (FIG. 1C) and the doped second dielectric spacer material 118 (FIG. 1C), respectively) or the thickness of the third dielectric spacer material 124 may be different than (e.g., less than or greater than) the thicknesses of one or more of each of first dielectric spacer structures 120 and each of the second dielectric spacer structures 122. In some embodiments, the thickness of the third dielectric spacer material 124 is substantially the same as the thicknesses of each of first dielectric spacer structures 120 and each of the second dielectric spacer structures 122. In addition, the third dielectric spacer material 124 may be formed to be substantially homogeneous throughout the thickness thereof, or the third dielectric spacer material 124 may formed to be heterogeneous throughout the thickness thereof. In some embodiments, the third dielectric spacer material 124 is formed to be substantially homogeneous throughout the thickness thereof.

The third dielectric spacer material 124 may be formed (e.g., conformally formed) using conventional processes (e.g., conventional conformal deposition processes), which are not described in detail herein. By way of non-limiting example, the third dielectric spacer material 124 may be formed using one or more of a conventional ALD process and a conventional conformal CVD process. In some embodiments, the third dielectric spacer material 124 is formed on surfaces of the first dielectric spacer structures 120, the second dielectric spacer structures 122, the first dielectric structures 108, the second dielectric structures 110, and the third conductive structure 106 using an ALD process.

Figure 1F:
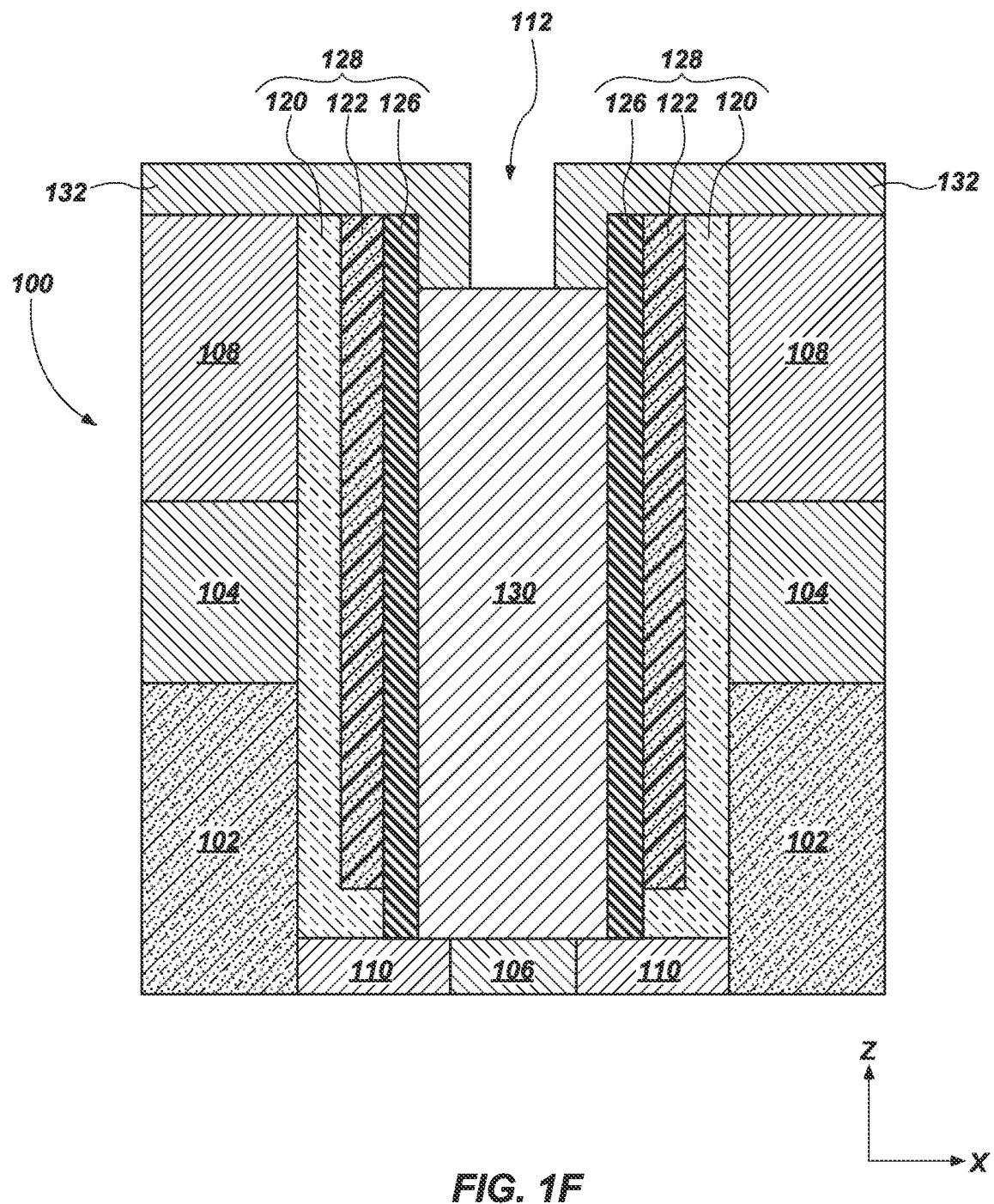

Referring next to FIG. 1F, portions of the third dielectric spacer material 124 (FIG. 1E) may be removed to form third dielectric spacer structures 126; a fourth conductive structure 130 (e.g., a conductive contact structure, such as a conductive plug) may be formed within a remainder of the opening 112; and dielectric liner structures 132 may be formed inside and outside of the opening 112. As shown in FIG. 1F, the third dielectric spacer structures 126 may be confined within boundaries (e.g., vertical boundaries, horizontal boundaries) of the opening 112, and may horizontally intervene (e.g., in the X-direction) between the fourth conductive structure 130 and each of the second dielectric spacer structures 122 and the first dielectric spacer structures 120. The fourth conductive structure 130 may horizontally extend (e.g., in the X-direction) from and between the third dielectric spacer structures 126, and may vertically overlie (e.g., in the Z-direction) and be in electrical contact (e.g., may directly physically contact) with the third conductive structure 106. The dielectric liner structures 132 may be formed on or over surfaces of the fourth conductive structure 130, the third dielectric spacer structures 126, the second dielectric spacer structures 122, the first dielectric spacer structures 120, and the first dielectric structures 108 at, inside, and outside of the boundaries of the opening 112. The dielectric liner structures 132 may partially (e.g., less than completely) fill portions of the opening 112 remaining unoccupied by the first dielectric spacer structures 120, the second dielectric spacer structures 122, the third dielectric spacer structures 126, and the fourth conductive structure 130.

As shown in FIG. 1F, the material removal process employed to form the third dielectric spacer structures 126 from the third dielectric spacer material 124 (FIG. 1E) may substantially (e.g., completely) remove portions of the third dielectric spacer material 124 above an upper vertical boundary of the opening 112, and may partially remove portions of the third dielectric spacer material 124 on or over upper surfaces of the third conductive structure 106 and the second dielectric structures 110 at a lower vertical boundary of the opening 112. The material removal process may substantially (e.g., completely) expose (e.g., uncover) the upper surface of third conductive structure 106 at the lower vertical boundary of the opening 112. The third dielectric spacer structures 126 may comprise remaining (e.g., unremoved) portions of the third dielectric spacer material 124 on surfaces of the first dielectric spacer structures 120, the second dielectric spacer structures 122, and the second dielectric structures 110 at and inside of the boundaries of the opening 112.

The material removal process to form the third dielectric spacer structures 126 may include subjecting the third dielectric spacer material 124 (FIG. 1E) to anisotropic etching (e.g., anisotropic dry etching, such as one or more of RIE, deep RIE, plasma etching, reactive ion beam etching, and chemically assisted ion beam etching; anisotropic wet etching, such as one or more of HF etching, buffered HF etching, and BOE). In some embodiments, an anisotropic dry etching process is employed to remove portions of the third dielectric spacer material 124 (FIG. 1E) to form the third dielectric spacer structures 126.

As shown in FIG. 1F, the third dielectric spacer structures 126, the second dielectric spacer structures 122, and the first dielectric spacer structures 120 may together form laminate spacer structures 128 of the apparatus 100. Each of the laminate spacer structures 128 may individually include one of the first dielectric spacer structures 120, one of the third dielectric spacer structures 126, and one of the second dielectric spacer structures 122 partially horizontally intervening (e.g., interposed) between (e.g., in the X-direction) the one of the first dielectric spacer structures 120 and the one of the third dielectric spacer structures 126. Each of the laminate spacer structures 128 may be confined within the boundaries (e.g., vertical boundaries, horizontal boundaries) of the opening 112, and may horizontally intervene between (e.g., in the X-direction) the fourth conductive structure 130 and each of the first conductive structures 102 and the second conductive structures 104.

The fourth conductive structure 130 may be formed of and include at least one electrically conductive material, such as one or more of at least one metal, at least alloy, at least one conductive metal oxide, at least one conductive metal nitride, at least one conductive metal silicide, and at least one conductively doped semiconductor material. By way of non-limiting example, the fourth conductive structure 130 may be formed of and include one or more of W, WN, WSi, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, RuTiN, and conductively doped silicon. A material composition of the fourth conductive structure 130 may be substantially the same as or different than materials compositions of the first conductive structures 102, the second conductive structures 104, and the third conductive structure 106. In some embodiments, the fourth conductive structure 130 is formed of and includes W.

As shown in FIG. 1F, the fourth conductive structure 130 may be formed to partially (e.g., less than completely) fill a portion of the opening 112 unoccupied by the laminate spacer structures 128. An upper surface of the fourth conductive structure 130 may vertically underlie (e.g., be vertically recessed from in the Z-direction) an upper vertical boundary of the opening 112. The upper surface of the fourth conductive structure 130 may vertically underlie (e.g., be vertically recessed from in the Z-direction) upper surfaces of the laminate spacer structures 128, including upper surfaces of the first dielectric spacer structures 120, the second dielectric spacer structures 122, and the third dielectric spacer structures 126 thereof.

The fourth conductive structure 130 may be formed using conventional processes (e.g., conventional material deposition processes, conventional material removal processes) and conventional processing equipment, which are not described in detail herein.

With continued reference to FIG. 1F, the dielectric liner structures 132 may be formed to horizontally extend (e.g., in the X-direction) completely over upper surfaces of the laminate spacer structures 128 (including upper surfaces of the first dielectric spacer structures 120, the second dielectric spacer structures 122, and the third dielectric spacer structures 126 thereof); and to horizontally extend (e.g., in the X-direction) partially over an upper surface of the fourth conductive structure 130. The dielectric liner structures 132 may also vertically extend (e.g., in the Z-direction) across upper portions of inner side surfaces of the laminate spacer structures 128 (e.g., upper portions of inner side surfaces of the third dielectric spacer structures 126 thereof). The dielectric liner structures 132 may substantially cover surfaces (e.g., upper surfaces, inner side surfaces) of the laminate spacer structures 128 exposed at and within the boundaries of the of the opening 112 following the formation of the fourth conductive structure 130, such as upper surfaces of the laminate spacer structures 128 and portions of inner side surfaces of the laminate spacer structures 128 vertically overlying the upper surface of the fourth conductive structure 130. A portion (e.g., a horizontally-central portion in the X-direction) of the upper surface of the fourth conductive structure 130 may not be covered by dielectric liner structures 132 (e.g., the portion of the upper surface of the fourth conductive structure 130 may be free of the dielectric liner structures 132 thereon).

The dielectric liner structures 132 may be formed of and include at least one dielectric material. The material composition of the dielectric liner structures 132 may be selected to be compatible with the material composition of the fourth conductive structure 130. As a non-limiting example, the dielectric liner structures 132 may be formed of and include at least one dielectric material substantially free of oxygen, such as one or more of a dielectric nitride material (e.g., $SiN_y$), and a dielectric carbonitride material (e.g., $SiC_zN_y$). In some embodiments, the dielectric liner structures 132 each comprise a dielectric nitride material (e.g., $Si_3N_4$).

Thicknesses of the dielectric liner structures 132 may at least partially dependent on the dimensions (e.g., width in the X-direction, height in the Z-direction) of the opening 112 and on the dimensions (e.g., widths) of the laminate spacer structures 128 within the opening 112. In some embodiments, the dielectric liner structures 132 are each formed to exhibit a thickness within a range of from about 2 nm to about 8 nm. In addition, the dielectric liner structures 132 may be formed to be substantially homogeneous throughout the thicknesses thereof, or the dielectric liner structures 132 may be formed to be heterogeneous throughout the thicknesses thereof. In some embodiments, the dielectric liner structures 132 are formed to be substantially homogeneous throughout the thicknesses thereof.

The dielectric liner structures 132 may be formed using conventional processes (e.g., conventional material deposition processes, conventional material removal processes), which are not described in detail herein. By way of non-limiting example, a dielectric liner material may be conformally formed on or over exposed surfaces of the first dielectric structures 108, the laminate spacer structures 128, and the fourth conductive structure 130 using one or more of a conventional ALD process and a conventional conformal CVD process. Thereafter, a portion of the dielectric liner material overlying the fourth conductive structure 130 may be removed (commonly referred to in the art as "punched through") to form the dielectric liner structures 132 and to expose a portion of the upper surface of the fourth conductive structure 130.

Figure 1G:
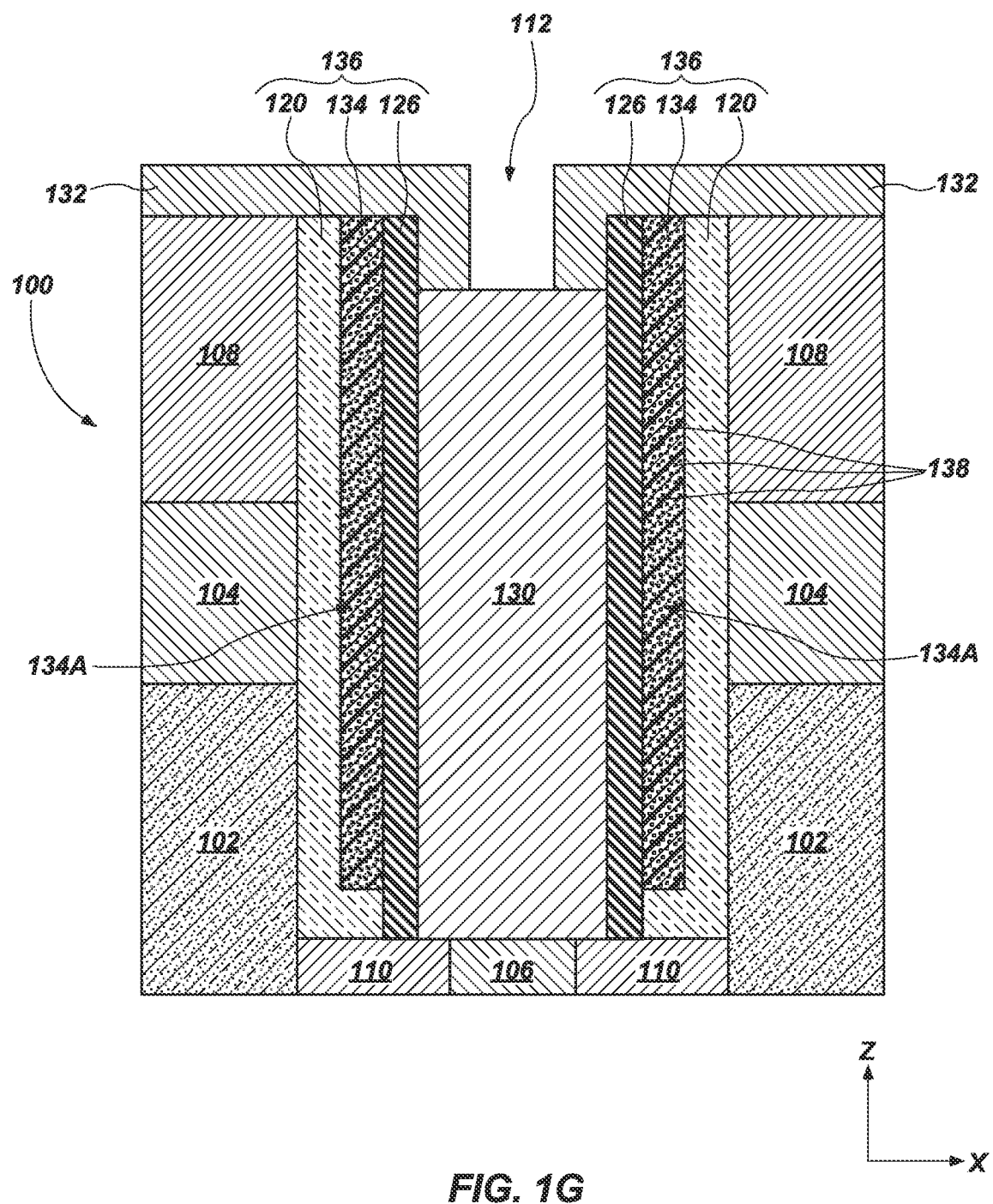

Referring next to FIG. 1G, the apparatus 100 at the processing stage depicted in FIG. 1F may be subjected to a thermal treatment (e.g., thermal annealing) process. During the thermal treatment process, individual units (e.g., individual ions) of dopant of the second dielectric spacer structure 122 (FIG. 1F) may migrate (e.g., diffuse) toward one another and interact (e.g., coalesce, react) to form modified second dielectric spacer structures 134 including discrete gas pockets 138 dispersed within a dielectric material (a remainder of the second dielectric spacer material 116 (FIG. 1B)). As shown in FIG. 1G, the thermal treatment process may convert the laminate spacer structures 128 (FIG. 1F) into modified laminate spacer structures 136 each individually including one of the first dielectric spacer structures 120, one of the third dielectric spacer structures 126, and one of the modified second dielectric spacer structures 134 partially horizontally intervening (e.g., interposed) between (e.g., in the X-direction) the one of the first dielectric spacer structures 120 and the one of the third dielectric spacer structures 126.

A dielectric constant of the modified laminate spacer structures 136 may be lower than the dielectric constant of the laminate spacer structures 128 (FIG. 1F). The relatively lower dielectric constant of the modified laminate spacer structures 136 is facilitated by the formation of the modified second dielectric spacer structures 134 including the discrete gas pockets 138. The discrete gas pockets 138 may lower the dielectric constant of the modified second dielectric spacer structures 134 relative to that of the second dielectric spacer structures 122 (FIG. 1F). The modified second dielectric spacer structures 134 may have a relatively lower dielectric constant than conventional dielectric spacer structures (e.g., conventional dielectric oxide spacer structures) not including the discrete gas pockets 138. The dielectric constant of the modified second dielectric spacer structures 134 may, for example, be lower than that of $SiO_2$, such as lower than about 3.9 (e.g., within a range of from about 1.5 to about 3.8, within a range of from about 2.0 to about 3.8, or within a range of from about 3.0 to about 3.8).

For each of the modified laminate spacer structures 136, the first dielectric spacer structure 120 thereof, the third dielectric spacer structure 126 thereof, and the dielectric liner structure 132 thereover may support and protect the modified second dielectric spacer structure 134 thereof. For example, the first dielectric spacer structure 120, the third dielectric spacer structure 126, and the dielectric liner structure 132 may together substantially encapsulate the modified second dielectric spacer structure 134, to provide structural support to the modified second dielectric spacer structure 134, and to protect the modified second dielectric spacer structure 134 during subsequent processing (e.g., etching) of the apparatus 100.

Widths (e.g., in the X-direction) of the modified laminate spacer structures 136 may correspond to (e.g., be substantially the same as) widths of the laminate spacer structures 128 (FIG. 1F). In some embodiments, each of the modified laminate spacer structures 136 individually has a width within a range of from about 5 nm to about 10 nm, such as from about 6 nm to about 9 nm. For each of the modified laminate spacer structures 136, the first dielectric spacer structure 120, the modified second dielectric spacer structure 134, and the third dielectric spacer structure 126 thereof may each individually have a thickness (e.g., a width in the X-direction) within a range of from about 2 nm to about 4 nm, such as within a range of from about 2 nm to about 3 nm. The thicknesses of the first dielectric spacer structures 120, the modified second dielectric spacer structures 134, and the third dielectric spacer structures 126 of the apparatus 100 may correspond to the thicknesses of the first dielectric spacer material 114 (FIGS. 1A and 1B), the second dielectric spacer material (FIG. 1B), and the third dielectric spacer material 124 (FIG. 1E) previously described herein.

With continued reference to FIG. 1G, the discrete gas pockets 138 of the modified second dielectric spacer structure 134 may each individually exhibit a maximum width (e.g., a maximum diameter) less than or equal to about one-third (⅓) the thickness (e.g., width in the X-direction) of the modified second dielectric spacer structure 134. By way of non-limiting example, each of the discrete gas pockets 138 may individually exhibit a maximum width within a range of from about one-fifth (⅕) the thickness of the modified second dielectric spacer structure 134 to about one-third (⅓) the thickness of the modified second dielectric spacer structure 134. If, for example, the modified second dielectric spacer structure 134 exhibits a thickness of about 3 nm, the discrete gas pockets 138 thereof may each individually exhibit a maximum width less than or equal to about 1 nm, such as within a range of from about 0.6 nm about 1 nm. In some embodiments, the discrete gas pockets 138 of the modified second dielectric spacer structure 134 each individually exhibit a maximum width within a range of from about 0.4 nm to about 1.3 nm. The widths of the discrete gas pockets 138 may at least partially dependent on the amount of dopant (e.g., hydrogen-containing species, such as $H^+$ and/or $H_2^+$) included in the second dielectric spacer structure 122 (FIG. 1F), and on the parameters (e.g., temperature, duration) of the thermal treatment process employed to form the modified second dielectric spacer structure 134. Each of the discrete gas pockets 138 may exhibit substantially the same dimensions and shape (e.g., a spherical shape) as each other of the discrete gas pockets 138, or one or more of the discrete gas pockets 138 may exhibit one or more of a different dimensions (e.g., a different width) and a different shape than one or more other of the discrete gas pockets 138.

Each of the discrete gas pockets 138 of the modified second dielectric spacer structures 134 may be filled with a gas comprising a neutral atomic state of the dopant of the second dielectric spacer structure 122 (FIG. 1F). By way of non-limiting example, if the dopant of the second dielectric spacer structures 122 (FIG. 1F) comprises one or more of $H^+$ and $H_2^+$, the discrete gas pockets 138 of the modified second dielectric spacer structures 134 may be filled with $H_2$ gas.

In some embodiments, the modified second dielectric spacer structures 134 are formed to have a substantially homogeneous (e.g., uniform, even, non-variable) distribution of the discrete gas pockets 138 thereof. For example, the modified second dielectric spacer structures 134 may each exhibit a substantially uniform distribution of the discrete gas pockets 138 throughout the vertical dimensions (e.g., in the Z-direction) and the horizontal dimensions (e.g., in the X-direction and another horizontal direction orthogonal to the X-direction) thereof.

In additional embodiments, the modified second dielectric spacer structures 134 are formed to have a heterogeneous (e.g., non-uniform, non-even, variable) distribution of the discrete gas pockets 138 thereof. For example, the modified second dielectric spacer structures 134 may each exhibit a non-uniform distribution of the discrete gas pockets 138 throughout one or more of the vertical dimensions (e.g., in the Z-direction) and the horizontal dimensions (e.g., in the X-direction) thereof. In some embodiments, the modified second dielectric spacer structures 134 are each formed to have a heterogeneous distribution of the discrete gas pockets 138 throughout the thickness (e.g., width in the X-direction) thereof. For example, amounts (e.g., quantities) of the discrete gas pockets 138 may vary (e.g., increase, decrease, increase and then decrease, decrease and then increase) in a direction extending away from the first dielectric spacer structures 120 and towards the third dielectric spacer structures 126. Amounts of the discrete gas pockets 138 may vary stepwise (e.g., change abruptly), or may vary continuously (e.g., change progressively, such as linearly or parabolically) throughout the thickness of each of the modified second dielectric spacer structures 134. In additional embodiments, the modified second dielectric spacer structures 134 are formed to have a heterogeneous distribution of the discrete gas pockets 138 throughout different vertical regions. For example, the modified second dielectric spacer structures 134 may have relatively increased amounts of the discrete gas pockets 138 in first vertically-extending regions 134A thereof relative to other vertical-extending regions of the modified second dielectric spacer structures 134. As shown in FIG. 1G, the first vertically-extending regions 134A may have vertical boundaries (e.g., upper vertical boundaries, lower vertical boundaries) corresponding to (e.g., substantially the same as) vertical boundaries of the second conductive structures 104. In additional embodiments, the first vertically-extending regions 134A each vertically extend (e.g., in the Z-direction) across the vertical dimensions (e.g., height) of the second conductive structures 104, but also vertically extend beyond one or more (e.g., each) of the vertical boundaries of the second conductive structures 104. For example, the upper vertical boundaries of the first vertically-extending regions 134A may be above the upper vertical boundaries of the second conductive structures 104, and/or the lower vertical boundaries of the first vertically-extending regions 134A may be below the lower vertical boundaries of the second conductive structures 104. Amounts of the discrete gas pockets 138 may vary stepwise (e.g., change abruptly), or may vary continuously (e.g., change progressively, such as linearly or parabolically) throughout the different vertical regions of the modified second dielectric spacer structures 134.

The thermal treatment process to form the modified second dielectric spacer structures 134 may include subjecting the apparatus 100 at the processing stage depicted in FIG. 1F to one or more elevated temperatures able to effectuate the migration (e.g., diffusion) and interaction (e.g., coalescence, reaction) of individual units (e.g., individual ions) of the dopant of the second dielectric spacer structures 122 (FIG. 1F) within the within the dielectric material of the second dielectric spacer structure 122 (FIG. 1F) to form the discrete gas pockets 138. By way of non-limiting example, the thermal treatment process may comprise a spike annealing process that includes ramping up to a spike peak temperature within a range of from about 1000° C. to about 1100° C. (e.g., about 1000° C.) in less than or equal to about five (5) seconds (e.g., within about one (1) second to about five (5) seconds, such as within about two (2) seconds to about five (5) seconds, or within about three (3) seconds to about five (5) seconds), exposing the apparatus 100 to the spike peak temperature for less than or equal to about two (2) seconds (e.g., less than or equal to about one (1) second), and then ramping down to a base temperature (e.g., room temperature, such as a temperature within a range of from about 15° C. to about 25° C.). During the thermal treatment process (e.g., spike annealing process), interfaces between the modified second dielectric spacer structures 134 and the other structures adjacent (e.g., horizontally adjacent, vertically adjacent) thereto (e.g., the first dielectric spacer structure 120, the third dielectric spacer structure 126, the dielectric liner structure 132) may impede (e.g., prevent) migration of the dopant of the second dielectric spacer structures 122 into the other structures. Accordingly, the dopant of may remain substantially confined with the boundaries (e.g., horizontal boundaries, vertical boundaries) of the second dielectric spacer structures 122 during the thermal treatment process.

Thus, an apparatus according to embodiments of the disclosure comprises a conductive structure, another conductive structure, and a laminate spacer structure interposed between the conductive structure and the another conductive structure in a first direction. The laminate spacer structure comprises a dielectric spacer structure, another dielectric spacer structure, and an additional dielectric spacer structure interposed between the dielectric spacer structure and the another dielectric spacer structure. The additional dielectric spacer structure comprises at least one dielectric material, and gas pockets dispersed within the at least one dielectric material.

Furthermore, an apparatus according to additional embodiments of the disclosure comprises first conductive structures, second conductive structures vertically overlying the first conductive structures; first dielectric structures vertically overlying the second conductive structures; second dielectric structures horizontally interposed between the first conductive structures; a third conductive structure horizontally interposed between the second dielectric structures; a fourth conductive structure vertically overlying the third conductive structure and horizontally interposed between each of the first conductive structures, each of the second conductive structures, and each of the first dielectric structures; laminate spacer structures horizontally interposed between the fourth conductive structure and the first conductive structures, the second conductive structures, and the first dielectric structures; and dielectric liner structures vertically overlying the laminate spacer structures and portions of the fourth conductive structure. Each of the laminate spacer structures comprises a first dielectric spacer structure, an second dielectric spacer structure horizontally adjacent the first dielectric spacer structure and comprising discrete gas pockets dispersed within a dielectric material, and a third dielectric spacer structure horizontally adjacent the second dielectric spacer structure.

Moreover, in accordance with embodiments of the disclosure, a method of forming an apparatus comprises forming laminate spacer structures within an opening interposed between conductive structures. Each of the laminate spacer structures comprises a first dielectric spacer structure; a second dielectric spacer structure inwardly adjacent the dielectric spacer structure and comprising a dielectric material impregnated with at least one dopant comprising one or more of H, He, and Ne; and a third dielectric spacer structure inwardly adjacent the second dielectric spacer structure. Another conductive structure is formed within the opening and interposed between the laminate spacer structures. The laminate spacer structures are heated to convert the second dielectric spacer structure of each of the laminate spacer structures to a modified second dielectric spacer structure comprising gas pockets dispersed within the dielectric material.

Figure 2:
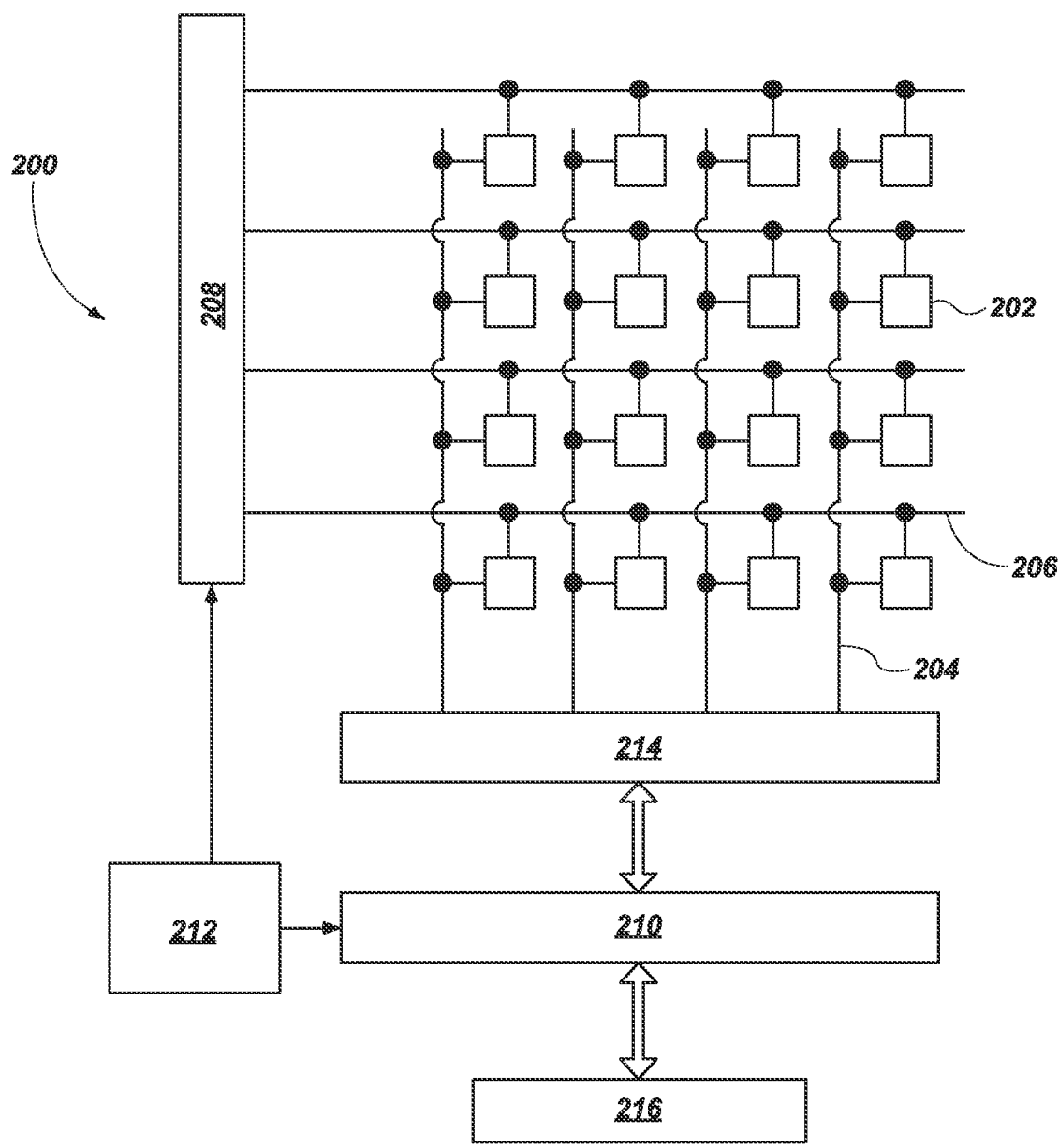
FIG. 2 is a functional block diagram of a memory device, in accordance with an embodiment of the disclosure.

FIG. 2 illustrates a functional block diagram of a memory device 200 (e.g., a DRAM device), in accordance with an embodiment of the disclosure. The memory device 200 may include, for example, an embodiment of the apparatus 100 previously described herein with reference to FIG. 1G. As shown in FIG. 2, the memory device 200 includes memory cells 202, digit lines 204, word lines 206, a row decoder 208, a column decoder 210, a memory controller 212, a sense device 214, and an input/output device 216.

The memory cells 202 of the memory device 200 are programmable to at least two different logic states (e.g., logic 0 and logic 1). Each memory cell 202 may individually include a capacitor and a transistor. The capacitor stores a charge representative of the programmable logic state (e.g., a charged capacitor may represent a first logic state, such as a logic 1; and an uncharged capacitor may represent a second logic state, such as a logic 0) of the memory cell 202. The transistor grants access to the capacitor upon application (e.g., by way of one of the word lines 206) of a minimum threshold voltage to a semiconductive channel thereof for operations (e.g., reading, writing, rewriting) on the capacitor. The transistor may be operably coupled to the capacitor by way of a conductive contact structure (e.g., the fourth conductive structure 130 previously described with reference to FIGS. 1F and 1G) in electrical communication with extending between the transistor and the capacitor (e.g., in electrical communication with between the capacitor and a source/drain contact connected to the semiconductive channel of the transistor).

The digit lines 204 (e.g., which may correspond to the second conductive structures 104 previously described with reference to FIGS. 1A through 1G) are connected to the capacitors of the memory cells 202 by way of the transistors of the memory cells 202. The digit lines 204 may be separated (e.g., electrically isolated) from the conductive contact structures (e.g., the fourth conductive structure 130 previously described with reference to FIGS. 1F and 1G) extending between the transistors and the capacitors of the memory cells 202 by way of the laminate spacer structures of the disclosure (e.g., the modified laminate spacer structures 136 previously described with reference to FIG. 1G). The word lines 206 extend perpendicular to the digit lines 204, and are connected to gates of the transistors of the memory cells 202. Operations may be performed on the memory cells 202 by activating appropriate digit lines 204 and word lines 206. Activating a digit line 204 or a word line 206 may include applying a voltage potential to the digit line 204 or the word line 206. Each column of memory cells 202 may individually be connected to one of the digit lines 204, and each row of the memory cells 202 may individually be connected to one of the word lines 206. Individual memory cells 202 may be addressed and accessed through the intersections (e.g., cross points) of the digit lines 204 and the word lines 206.

The memory controller 212 may control the operations of memory cells 202 through various components, including the row decoder 208, the column decoder 210, and the sense device 214. The memory controller 212 may generate row address signals that are directed to the row decoder 208 to activate (e.g., apply a voltage potential to) predetermined word lines 206, and may generate column address signals that are directed to the column decoder 210 to activate (e.g., apply a voltage potential to) predetermined digit lines 204. The memory controller 212 may also generate and control various voltage potentials employed during the operation of the memory device 200. In general, the amplitude, shape, and/or duration of an applied voltage may be adjusted (e.g., varied), and may be different for various operations of the memory device 200.

During use and operation of the memory device 200, after being accessed, a memory cell 202 may be read (e.g., sensed) by the sense device 214. The sense device 214 may compare a signal (e.g., a voltage) of an appropriate digit line 204 to a reference signal in order to determine the logic state of the memory cell 202. If, for example, the digit line 204 has a higher voltage than the reference voltage, the sense device 214 may determine that the stored logic state of the memory cell 202 is a logic 1, and vice versa. The sense device 214 may include transistors and amplifiers to detect and amplify a difference in the signals (commonly referred to in the art as "latching"). The detected logic state of a memory cell 202 may be output through the column decoder 210 to the input/output device 216. In addition, a memory cell 202 may be set (e.g., written) by similarly activating an appropriate word line 206 and an appropriate digit line 204 of the memory device 200. By controlling the digit line 204 while the word line 206 is activated, the memory cell 202 may be set (e.g., a logic value may be stored in the memory cell 202). The column decoder 210 may accept data from the input/output device 216 to be written to the memory cells 202. Furthermore, a memory cell 202 may also be refreshed (e.g., recharged) by reading the memory cell 202. The read operation will place the contents of the memory cell 202 on the appropriate digit line 204, which is then pulled up to full level (e.g., full charge or discharge) by the sense device 214. When the word line 206 associated with the memory cell 202 is deactivated, all of memory cells 202 in the row associated with the word line 206 are restored to full charge or discharge.

Thus, a memory device according to embodiments of the disclosure comprises a memory controller, a row decoder, a column decoder, word lines, digit lines, memory cells, conductive contact structures, and laminate spacer structures. The row decoder is operably coupled to the memory controller. The column decoder is operably coupled to the memory controller. The word lines are operably coupled to the row decoder. The digit lines extend perpendicular to the word lines and are operably coupled to the column decoder. The memory cells positioned at intersections of the word lines and the digit lines, and comprise capacitors and transistors electrically connected to the capacitors. The conductive contact structures are operably coupled to and extend between the transistors of the memory cells and the capacitors of the memory cells. The laminate spacer structures are interposed between the digit lines and the conductive contact structures. Each of the laminate spacer structures comprises a low-k dielectric spacer structure interposed between at least two other dielectric spacer structures. The low-k dielectric spacer structure comprises nano-sized gas pockets dispersed within a dielectric material.

Figure 3:
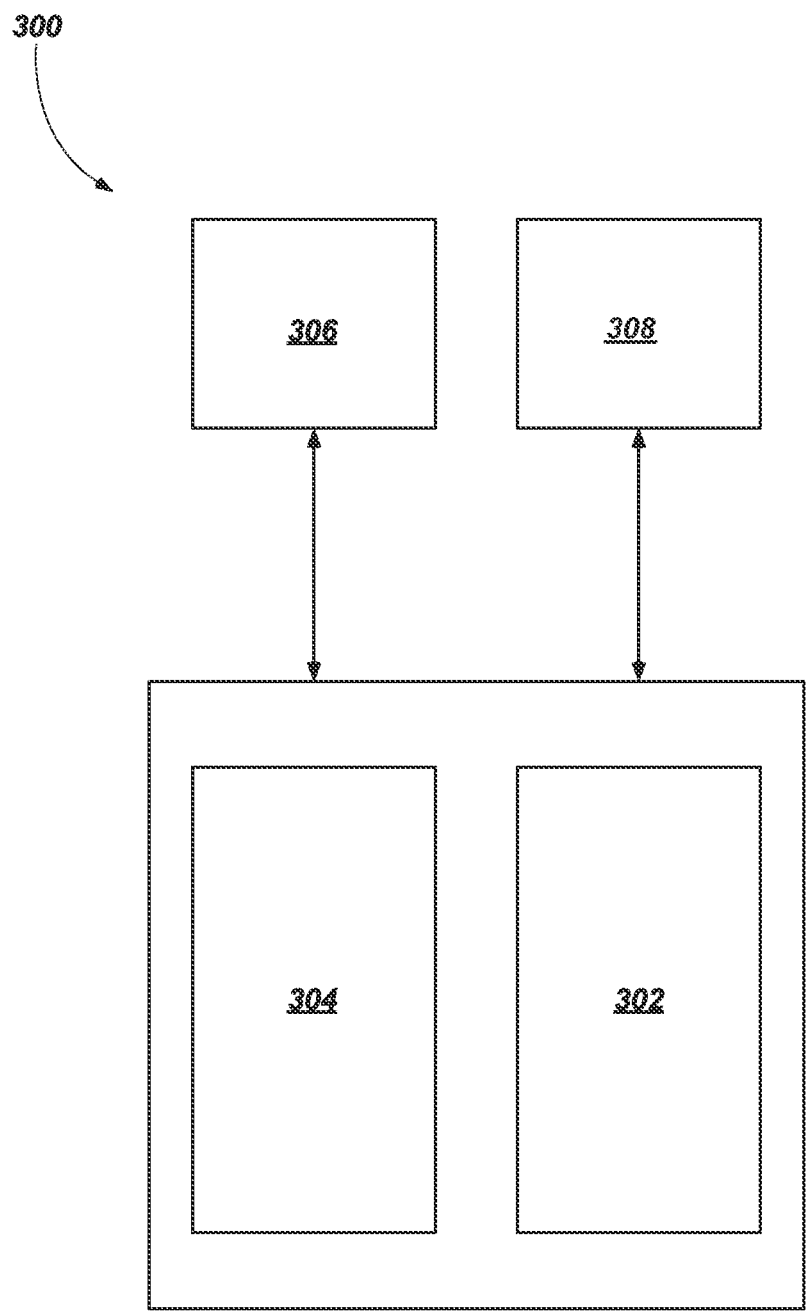
FIG. 3 is a schematic block diagram of an electronic system, in accordance with an embodiment of the disclosure.

Apparatuses (e.g., the apparatus 100 previously described with reference to FIG. 1G) and electronic devices (e.g., the memory device 200 previously described with reference to FIG. 2) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The electronic system 300 includes at least one memory device 302. The memory device 302 may comprise, for example, an embodiment of one or more of an apparatus (e.g., the apparatus 100 previously described with reference to FIG. 1G) and a microelectronic device (e.g., the memory device 200 previously described with reference to FIG. 2) previously described herein. The electronic system 300 may further include at least one electronic signal processor device 304 (often referred to as a "microprocessor"). The electronic signal processor device 304 may, optionally, include an embodiment of an apparatus (e.g., the apparatus 100 previously described with reference to FIG. 1G) and an electronic device (e.g., the memory device 200 previously described with reference to FIG. 2) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, an electronic system according to embodiments of the disclosure comprises an input device, an output device, a processor device operably coupled to the input device and the output device, and a memory device operably coupled to the processor device. The memory device comprises neighboring conductive structures, and a laminate spacer structure intervening between the neighboring conductive structures. The laminate spacer structure comprises a first dielectric spacer structure adjacent a first of the neighboring conductive structures, a second dielectric spacer structure interposed between the first dielectric spacer structure and a second of the neighboring conductive structures, and a third dielectric spacer structure interposed between the second dielectric spacer structure and the second of the neighboring conductive structures. The second dielectric spacer structure has a lower dielectric constant than $SiO_2$ and comprising a dielectric material and discrete gas pockets dispersed within the dielectric material.

The structures (e.g., the modified laminate spacer structures 136 (FIG. 1G)), apparatuses (e.g., the apparatus 100 (FIG. 1G)), electronic devices (e.g., the memory device 200 (FIG. 2)), electronic systems (e.g., the electronic system 300 (FIG. 3)), and methods of the disclosure facilitate improved performance, reduced costs (e.g., manufacturing costs, material costs), increased miniaturization of components, and greater packaging density as compared to conventional structures, conventional apparatuses, conventional devices, conventional systems, and conventional methods. For example, the structures, apparatuses, and methods of the disclosure may effectuate a reduction in undesirable capacitive coupling between neighboring conductive structures at greater packaging densities relative to conventional structures, conventional apparatuses, conventional devices, conventional systems, and conventional methods. The structures, apparatuses, electronic devices, electronic systems, and methods of the disclosure may improve scalability, efficiency, and simplicity as compared to conventional structures, conventional apparatuses, conventional devices, conventional systems, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A method of forming an apparatus, comprising:
forming a first dielectric spacer material on surfaces within and beyond boundaries of an opening extending through one or more conductive materials;
forming a second dielectric spacer material on surfaces of the first dielectric spacer material;
doping the second dielectric spacer material with one or more of H, He, and Ne to form a doped second dielectric spacer material;
removing portions of the first dielectric spacer material and the doped second dielectric spacer material to respectively form a first dielectric spacer structure and a second dielectric spacer structure substantially confined within the boundaries of the opening;
forming a third dielectric spacer material on surfaces of the first dielectric spacer structure and the second dielectric spacer structure;
removing portions of the third dielectric spacer material to form a laminate spacer structure comprising the first dielectric spacer structure, the second dielectric spacer structure, and a third dielectric spacer structure comprising a remaining portion of the third dielectric spacer material;
partially filling a remaining portion of the opening with a conductive material after forming the laminate spacer structure;
forming a dielectric liner covering exposed surfaces of the laminate spacer structure after partially filling the remaining portion of the opening with the conductive material; and
heating the laminate spacer structure, after forming the dielectric liner, to form gas pockets dispersed within the second dielectric spacer structure of the laminate spacer structure.

2. The method of claim 1, wherein doping the second dielectric spacer material comprises implanting one or more of atomic hydrogen ions ($H^+$) and ionized molecular hydrogen ($H_2^+$) into the second dielectric spacer material.

3. The method of claim 1, wherein doping the second dielectric spacer material comprises subjecting the second dielectric spacer material to a plasma doping implantation process employing an implantation dose within a range of from about 2.0E16 ions per square centimeter ($cm^2$) to about 1.0E17 ions/$cm^2$ using an acceleration voltage of about 500 volts (V).

4. The method of claim 1, wherein doping the second dielectric spacer material comprises subjecting the second dielectric spacer material to a beam-line implantation process employing an implantation dose within a range of from about 2.0E15 ions/$cm^2$ to about 2.5E16 ions/$cm^2$ using an acceleration voltage of about 500 V.

5. The method of claim 4, wherein the beam-line implantation process further employs a beam-line tilt angle of about 10 degrees.

6. A method of forming an apparatus, comprising:
forming laminate spacer structures within an opening interposed between conductive structures, each of the laminate spacer structures comprising:
a first dielectric spacer structure;
a second dielectric spacer structure inwardly adjacent the first dielectric spacer structure and comprising a dielectric material impregnated with at least one dopant comprising one or more of H, He, and Ne; and
a third dielectric spacer structure inwardly adjacent the second dielectric spacer structure;
forming another conductive structure within the opening and interposed between the laminate spacer structures; and
heating the laminate spacer structures to convert the second dielectric spacer structure of each of the laminate spacer structures to a modified second dielectric spacer structure comprising gas pockets dispersed within the dielectric material.

7. The method of claim 6, wherein forming the laminate spacer structures comprises forming the second dielectric spacer structure of each of the laminate spacer structures to exhibit a width within a range of from about 2 nm to about 3 nm.

8. The method of claim 6, wherein forming laminate spacer structures comprises forming the second dielectric spacer structure of each of the laminate spacer structures to have a substantially homogeneous distribution of the at least one dopant.

9. The method of claim 6, wherein forming laminate spacer structures comprises forming the second dielectric spacer structure of each of the laminate spacer structures to have a heterogeneous distribution of the at least one dopant.

10. The method of claim 6, wherein heating the laminate spacer structures to convert the second dielectric spacer structure of each of the laminate spacer structures to a modified second dielectric spacer structure comprises spike annealing the second dielectric spacer structure of each of the laminate spacer structures to diffuse and coalesce the at least one dopant thereof to form the gas pockets of the modified second dielectric spacer structure.

11. The method of claim 6, further comprising forming dielectric liner structures over exposed surfaces of the laminate spacer structures prior to heating the laminate spacer structures.

12. The method of claim 6, wherein forming laminate spacer structures within an opening comprises:
forming a first dielectric spacer material inside and outside of the opening;
forming a second dielectric spacer material over surfaces of the first dielectric spacer material inside and outside of the opening;
implanting the at least one dopant into the second dielectric spacer material to from a doped second dielectric spacer material;
removing portions of the first dielectric spacer material and the doped second dielectric spacer material to form the first dielectric spacer structure and the second dielectric spacer structure for each of the laminate spacer structures;
forming a third dielectric spacer material over exposed surfaces at, inside, and outside of boundaries of the opening; and
removing portions of the third dielectric spacer material to form the third dielectric spacer structure for each of the laminate spacer structures.

13. The method of claim 12, wherein implanting the at least one dopant into the second dielectric spacer material comprises implanting one or more of $H^+$ and $H_2^+$ into the second dielectric spacer material.

14. A method of forming an apparatus, comprising:
forming a first dielectric structure within an opening at least partially extending through one or more conductive materials;
forming a second dielectric structure doped with one or more of H, He, and Ne on surfaces of the first dielectric structure within the opening;
forming a third dielectric structure on exposed surfaces of the second dielectric structure within the opening to form a laminate spacer structure comprising the first dielectric structure, the second dielectric structure, and the third dielectric structure; and
heating the laminate spacer structure to effectuate migration of the one or more of H, He, and Ne within the second dielectric structure thereof and form gas pockets dispersed within dielectric material of the second dielectric structure.

15. The method of claim 14, further comprising forming a conductive structure within a remaining portion of the opening after forming the laminate spacer structure.

16. The method of claim 14, wherein heating the laminate spacer structure comprises subjecting the laminate spacer structure to a temperature within a range of from about 1000° C. to about 1100° C. for a period of time within a range of from about one second to about five seconds.

17. The method of claim 14, wherein forming a first dielectric structure and forming a second dielectric structure comprises:
conformally forming a first dielectric material on exposed surfaces within the opening;
conformally forming a second dielectric material on an upper surface of the first dielectric material;
implanting the one or more of H, He, and Ne into the second dielectric material to form a doped second dielectric material; and
removing portions of the first dielectric material and the doped second dielectric material to form the first dielectric structure and the second dielectric structure, a portion of the first dielectric structure extending from a lower boundary of the second dielectric structure to a lower boundary of the opening.

18. The method of claim 17, wherein forming a third dielectric structure comprises:
conformally forming a third dielectric material within the opening; and
removing a portion of the third dielectric material adjacent the lower boundary of the opening to form the third dielectric structure, the third dielectric material directly horizontally adjacent an inner side surfaces of the second dielectric structure and the portion of the first dielectric structure.

19. The method of claim 18, further comprising:
forming a conductive contact structure within the opening and directly horizontally adjacent the third dielectric structure, a upper boundary of the conductive contact structure vertically below an upper boundary of the laminate spacer structure; and
forming dielectric liner structures completely covering an upper surface of the laminate spacer structure and partially covering an upper surface of the conductive contact structure.

20. The method of claim 19, wherein heating the laminate spacer structure comprises heating the laminate spacer structure after forming the conductive contact structure and the dielectric liner structures.

* * * * *

UNITED STATES PATENT AND TRADEMARK OFFICE
CERTIFICATE OF CORRECTION

PATENT NO.         : 11,729,964 B2
APPLICATION NO.    : 17/449352
DATED              : August 15, 2023
INVENTOR(S)        : Silvia Borsari et al.

It is certified that error appears in the above-identified patent and that said Letters Patent is hereby corrected as shown below:

In the Specification
Column 1,   Line 10,   change "Nov. 2, 20221, the" to --Nov. 2, 2021, the--
Column 19,  Line 5,    change "second dielectric, spacer" to --second dielectric spacer--

Signed and Sealed this
Seventeenth Day of October, 2023

Katherine Kelly Vidal
*Director of the United States Patent and Trademark Office*